(12) United States Patent
Lim et al.

(10) Patent No.: US 8,786,080 B2
(45) Date of Patent: Jul. 22, 2014

(54) SYSTEMS INCLUDING AN I/O STACK AND METHODS FOR FABRICATING SUCH SYSTEMS

(75) Inventors: Chooi Pei Lim, Bayan Lepas (MY); Jordan Plofsky, San Jose, CA (US); Yee Liang Tan, Gelugor (MY); Teik Tiong Toong, Simpang Ampat (MY)

(73) Assignee: Altera Corporation, San Jose, CA (US)

( * ) Notice: Subject to any disclaimer, the term of this patent is extended or adjusted under 35 U.S.C. 154(b) by 11 days.

(21) Appl. No.: 13/046,247

(22) Filed: Mar. 11, 2011

(65) Prior Publication Data

US 2012/0228760 A1 Sep. 13, 2012

(51) Int. Cl.
*H01L 23/48* (2006.01)

(52) U.S. Cl.
USPC ............... 257/737; 257/E21.499; 257/E23.01

(58) Field of Classification Search
CPC .... H01L 27/11898; H01L 23/48; H01L 21/50
USPC ........................ 257/737, E21.499; 438/E23.01
See application file for complete search history.

(56) References Cited

U.S. PATENT DOCUMENTS

| | | | |
|---|---|---|---|
| 5,371,422 A | 12/1994 | Patel et al. | |
| 7,701,252 B1 | 4/2010 | Chow et al. | |
| 7,808,075 B1 | 10/2010 | Cheng et al. | |
| 7,883,947 B1 * | 2/2011 | Cheng et al. ............ | 438/171 |
| 2001/0000013 A1 * | 3/2001 | Lin ....................... | 257/777 |
| 2005/0199994 A1 * | 9/2005 | Morishita et al. ....... | 257/686 |
| 2007/0235885 A1 * | 10/2007 | Kawano ................. | 257/778 |
| 2009/0309675 A1 | 12/2009 | Bavisi et al. | |
| 2010/0148344 A1 | 6/2010 | Chandra et al. | |
| 2012/0018885 A1 * | 1/2012 | Lee et al. .............. | 257/738 |
| 2012/0049376 A1 * | 3/2012 | Harada et al. .......... | 257/773 |
| 2012/0056327 A1 * | 3/2012 | Harada et al. .......... | 257/773 |

FOREIGN PATENT DOCUMENTS

EP 1255202 11/2002

OTHER PUBLICATIONS

Granski, Miki, "Programmable IDs: the next Innovation Engine", Nov. 15, 2010, 4 pages.
Patel, Rakesh H., U.S. Appl. No. 12/431,625 entitled "Stacked Chip Package" filed Apr. 28, 2009, 25 pages.
Patel, Rakesh H., U.S. Appl. No. 11/897,916 entitled "Die Partitioning and Leveraging" filed Aug. 31, 2007, 31 pages.
European Extended Search Report dated Aug. 20, 2012 issued in Application No. 12158947.7.

* cited by examiner

*Primary Examiner* — Marc Armand
(74) *Attorney, Agent, or Firm* — Weaver Austin Villeneuve & Sampson LLP

(57) ABSTRACT

Systems including an input/output (I/O) stack and methods for fabricating such systems are described. In one implementation, the methods include stacking an I/O die including I/O elements and excluding a logic element. Also in one implementation, the methods further include stacking an integrated circuit die with respect to the I/O die. The integrated circuit includes logic elements and excludes an I/O element. The separation of the I/O die from the integrated circuit die provides various benefits, such as independent development of each of the dies and more space for the I/O elements on an I/O substrate of the I/O die compared to that in a conventional die. The increase in space allows new process generation of the integrated circuit die in which an increasing number of logic elements are fitted within the same surface area of a substrate of the integrated circuit die.

14 Claims, 14 Drawing Sheets

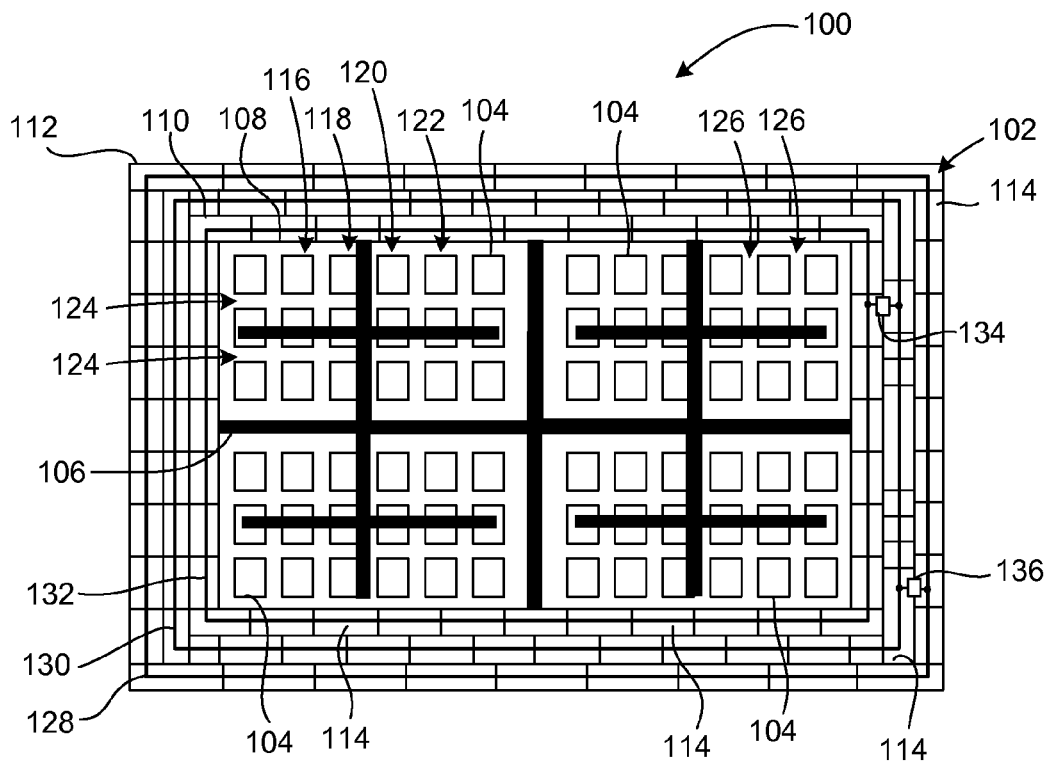
*FIG. 1*
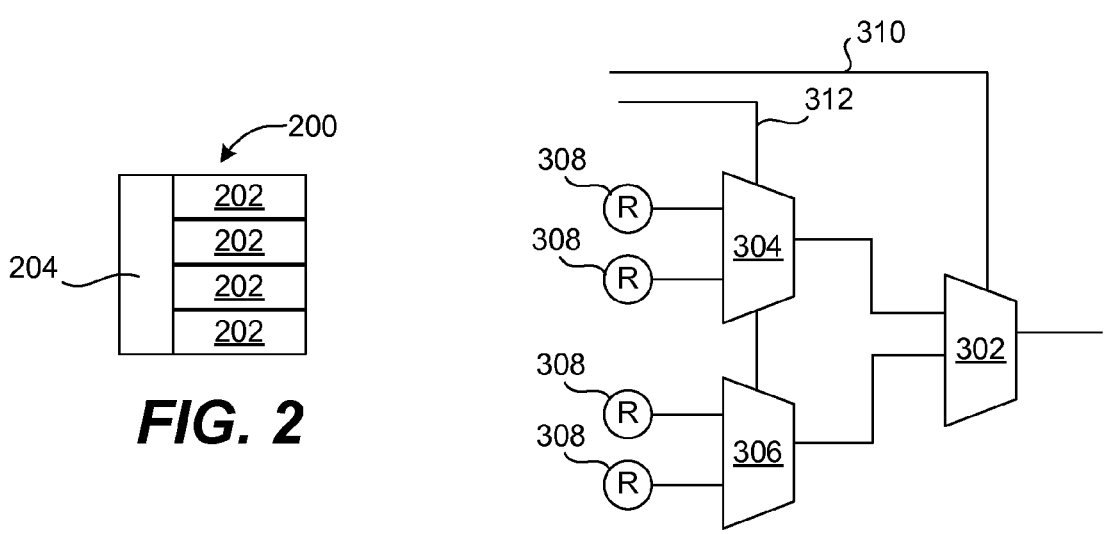
*FIG. 2*
*FIG. 3*

SYSTEMS INCLUDING AN I/O STACK AND METHODS FOR FABRICATING SUCH SYSTEMS

FIELD OF THE INVENTION

The present invention generally relates to input/output (I/O) stacks.

BACKGROUND

In each new generation of semiconductor processing, a variety of changes are observed, such as, increasing processing and tooling costs, increasing design, verification and testing costs, and increasing development and deployment time. The rate of these changes is greater than the rate of change of the input/output (I/O) requirements of the devices. In addition, the improved logic and memory area reduction that each new process generation provides does not scale equally with circuits that include I/O and non-logic structures, such as, for example, analog, phase locked loop (PLL), voltage regulator, and electro static discharge (ESD) structures, because these circuits use thick oxide transistors. Many semiconductor devices become bound by the I/O of a die, and the logic and memory density in each new process is sometimes limited by the number of I/Os.

SUMMARY OF THE INVENTION

Embodiments of the present invention relate to an I/O stack and systems and methods for its fabrication. The methods include stacking an I/O die including I/O elements and excluding a logic element. The methods further include stacking an integrated circuit die with respect to the I/O die. The integrated circuit includes logic elements and excludes an I/O element. The separation of the I/O die from the integrated circuit die provides various benefits, such as independent development of each of the dies and more space for the I/O elements on an I/O substrate of the I/O die compared to that in a conventional die. The increase in space allows new process generation of the integrated circuit die in which more logic elements are fitted within the same surface area on a substrate of the integrated circuit die.

In various embodiments, the number of logic elements on the integrated circuit die may be greater than the number of I/O elements on the integrated circuit die. Moreover, the number of I/O elements on the I/O die may be greater than the number of logic elements on the I/O die.

In one aspect, a method for fabricating an I/O stack is provided. One embodiment of the method includes stacking an I/O die including a first set of elements with respect to an integrated circuit die. The integrated circuit includes a second set of elements other than an I/O element. The elements of the first set are other than a logic element. Moreover, the first set of elements includes a plurality of I/O elements and the second set of elements includes a plurality of logic elements.

In another aspect, an I/O stack is provided. In one embodiment, the I/O stack includes an I/O die and an integrated circuit die that is stacked with respect to the I/O die. The I/O die includes multiple I/O elements and excludes a logic element and the integrated circuit die includes multiple logic elements and excludes an I/O element.

The separation of the I/O die from the integrated circuit die allows for reusing the I/O dies with other integrated circuits, including an upgraded integrated circuit. Moreover, the separation allows for more I/O elements to be fitted on the I/O die than that fitted in a conventional die for the same amount of logic elements of the integrated circuit die.

BRIEF DESCRIPTION OF THE DRAWINGS

The invention may best be understood by reference to the following description taken in conjunction with the accompanying drawings, which illustrate specific embodiments of the present systems and methods.

FIG. 1 shows an exemplary block diagram of an embodiment of an integrated circuit die in accordance with one embodiment of the present invention.

FIG. 2 shows an exemplary block diagram of an embodiment of a logic array block of the integrated circuit die in accordance with one embodiment of the present invention.

FIG. 3 shows an exemplary circuit diagram of an embodiment of a logic element of the logic array block in accordance with one embodiment of the present invention.

DETAILED DESCRIPTION

Figure 4:
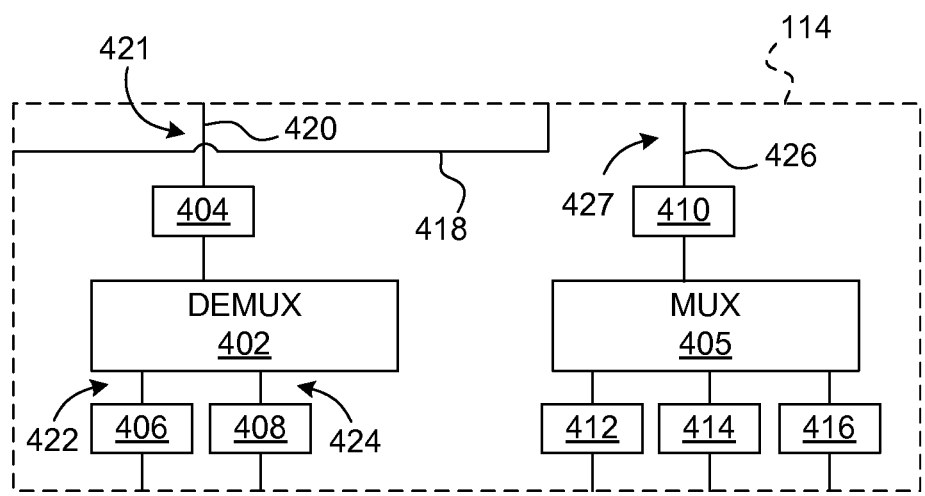
FIG. 4 shows an exemplary block diagram of an embodiment of an interface unit of the integrated circuit die in accordance with one embodiment of the present invention.

FIG. 1 shows an exemplary block diagram of an embodiment of an integrated circuit die 100 in accordance with one embodiment of the present invention. Integrated circuit die 100 includes an integrated circuit substrate (not shown) and an integrated circuit 102, which in one embodiment is a field programmable gate array (FPGA). Integrated circuit 102 includes multiple blocks 104, a clock network 106, and multiple interface layers 108, 110, and 112. To avoid cluttering FIG. 1, only some (but not all) of the blocks in FIG. 1 have been referenced with the reference number 104. Multiple interface layers include inner interface layer 108, middle interface layer 110, and outer interface layer 112. Multiple interface layers 108, 110, and 112 increase the interfacing capability of an input/output (I/O) die and reduce signal congestion between the integrated circuit die 100 and the I/O die. Each interface layer 108, 110, and 112 includes multiple interface units 114, only some (but not all) of which are referenced as such to avoid cluttering FIG. 1.

Each block 104 may be a logic array block (LAB), an embedded array block (EAB), a digital signal processing (DSP) block, and/or a buffer, to name a few. For example, in one embodiment, all blocks 104 are LABs. In another embodiment, LABs and buffers may be intermittently laid within integrated circuit 102. In this exemplary embodiment, a column 116 of blocks 104 includes LABs, an adjacent column 118 of blocks 104 includes buffers, an adjacent column 120 of blocks 104 includes LABs, and so on. In another embodiment, one column, e.g., column 122 of blocks 104, includes EABs. An EAB may be a random access memory (RAM) block. Block 104 may include one or more registers or one or more mathematical elements, such as adders or multipliers. In one embodiment, a DSP block, EAB, register, or clock network 106 includes thin oxide transistors. It is noted that integrated circuit 102 does not include any I/O elements or it may have very minimal number of I/O elements. I/O elements are described below.

Blocks 104 may be coupled with each other via multiple interconnects, e.g., multiple horizontal interconnects 124 and vertical interconnects 126. Horizontal interconnects 124 are located in rows between blocks 104 and vertical interconnects 126 are located in columns between blocks 104. Clock network 106 is overlaid on blocks 104 to communicate a clock signal to blocks 104, horizontal interconnect 124, and/or vertical interconnect 126. In one embodiment, clock network 106 spans as an H-tree structure. For example, integrated circuit die 100 may be symmetric and blocks 104 may be distributed evenly across integrated circuit die 100 and clock network 106 may span in an H-tree structure. In one embodiment, a symmetric integrated circuit die achieves the same or better performance as a conventional die, including a conventional FPGA. For example, in one embodiment, a maximum frequency of integrated circuit 102 is the same or better than the conventional die and has similar timing performance as that of the conventional FPGA.

The outer interface layer 112 includes an outer global line 128, the middle interface layer 110 includes a middle global line 130, and the inner interface layer 108 includes an inner global line 132. The middle global line 130 is coupled with the inner global line 132 via a switch 134 and the middle global line 130 is coupled with the outer global line 128 via a switch 136. Switch 134 or 136 may be a transistor. Each switch 134 or 136 has a state, such as open or close. The state of the switch 134 or 136 is controlled by a value, such as one or zero, of a configuration bit within a storage unit (not shown) coupled with the switch 134 or 136. The storage unit may be a register or a RAM cell. The inner global line 132 and the middle global line 130 receive the same global signal if the switch 134 is turned on by asserting a value of the configuration bit within a storage unit that is coupled with the switch 134. If switch 134 is turned off by deasserting a value of the configuration bit within a storage unit coupled with the switch, inner global line 132 and middle global line 130 may receive different global signals. The switch 136 operates substantially similar to that of switch 134 discussed above.

Each global line 128, 130, and 132 receives a global signal, which may be a clock signal, an enable signal, or a clear signal. The clock signal received via one or more global lines 128, 130, and 132 is supplied via clock network 106 to a portion of or the entire integrated circuit 102. Block 104 receives one or more signals from horizontal interconnect 124 or vertical interconnect 126 to perform an operation, such as a storage operation, a digital signal processing operation, a logic operation, and/or a mathematical operation on the one or more signals to generate one or more output signals that are provided to the horizontal interconnect 124 or vertical interconnect 126.

Integrated circuit die 100 is scalable and supports various ranges of logic density, e.g., density of logic elements (LEs) on an integrated circuit substrate. The LEs of integrated circuit die 100 occupy a smaller, the same, or larger surface area of an externally-connected substrate than that occupied by I/O elements.

Although three interface layers 108, 110, and 112 are shown, in another embodiment, integrated circuit die 100 includes any number of interface layers. Moreover, in an alternative embodiment, two or more adjacent blocks 104 may be combined into a MegaRAM block. Furthermore, although each row of integrated circuit die 100 is divided into two sub-rows, in an alternative embodiment, the row may not be divided into sub-rows. In another embodiment, each row of integrated circuit die 100 may be divided into more than two sub-rows. In yet another embodiment, the outer global line 128 is coupled with the inner global line 132 via a switch similar to switch 134 or 136.

FIG. 2 shows an exemplary block diagram of an embodiment of a logic array block 200 of the integrated circuit die 100 in accordance with one embodiment of the present invention. Logic array block 200 is an example of block 104 (FIG. 1). LAB 200 includes multiple LEs 202, which may be made from thin oxide transistors. Each LE 202 may be coupled with any of the remaining LEs 202 via one or more local lines 204. Local lines 204 are coupled with the horizontal interconnect 124 and/or the vertical interconnect 126. It is appreciated that the LAB 200 including four LEs 202 is exemplary and not intended to limit the scope of the present invention. For example, LAB 200 may include fewer than four LEs 202 or it may include more than four LEs 202.

FIG. 3 shows an exemplary circuit diagram of an embodiment of the logic element 202 of the logic array block 200 in accordance with one embodiment of the present invention. LE 202 includes a multiplexer 302 at a first level and multiplexers 304 and 306 at a second level. LE 202 further includes storage units 308. LE 202 is a two-input look-up table (LUT) that receives two select inputs 310 and 312. LE 202 outputs a bit stored within any of storage units 308 based on the value of the select input signals 310 and 312. It is appreciated that LE 202 may be an m-input LUT, where m is a positive integer other than two.

FIG. 4 shows an exemplary block diagram of an embodiment of interface unit 114 of the integrated circuit die 100 in accordance with one embodiment of the present invention. Interface unit 114 includes a demultiplexer 402, a multiplexer 405, multiple drivers 404, 406, 408, 410, 412, 414, and 416, and a portion 418 of a global line. It is appreciated that portion 418 of the global line is a portion of the inner global line 132 if the interface unit 114 is a portion of the inner interface layer 108. It is further appreciated that portion 418 is a portion of middle global line 130 if interface unit 114 is a portion of middle interface layer 110. Moreover, it is appreciated that portion 418 is a portion of outer global line 128 if interface unit 114 is a portion of outer interface layer 112. Each driver 404, 406, 408, 410, 412, 414, and 416 may be a gate, such as a pass-through gate or an inverter.

Demultiplexer 402 receives an input signal 421 via an input line 420 and driver 404. The demultiplexer 402 demultiplexes the input signal 421, based on a value of select input signals received at select inputs of the demultiplexer 402, and outputs demultiplexed signals 422 and 424. The demultiplexed signals 422 and 424 are transmitted, via drivers 406 and 408, to vertical interconnect 126 or horizontal interconnect 124 coupled with demultiplexer 402. Moreover, the multiplexer 405 receives multiple signals from horizontal interconnect 124 or vertical interconnect 126, via the drivers 412, 414, and 416. The multiplexer 405 multiplexes the multiple signals, based on the values of the select input signals received by the multiplexer 405, and sends an output signal 427 via driver 410 to an output line 426. It is appreciated that the use of seven drivers is exemplary and not intended to limit the scope of the present invention. For example, in one embodiment fewer than or more than seven drivers may be used.

Figure 5:
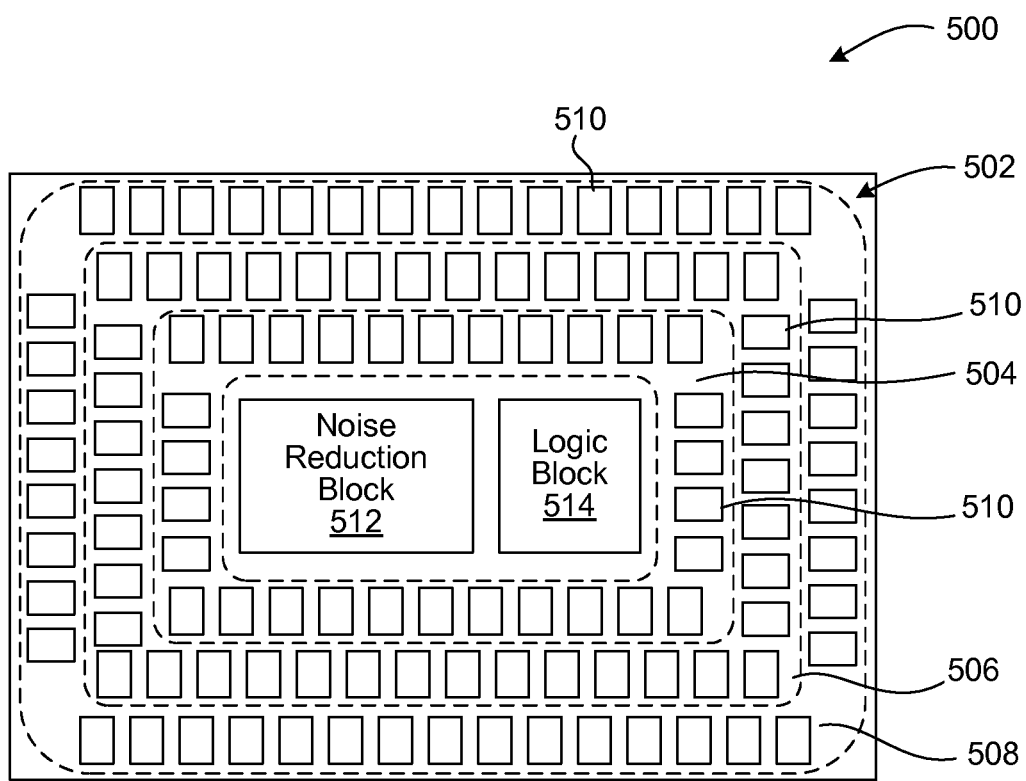
FIG. 5 shows an exemplary block diagram of an embodiment of an input/output (I/O) die in accordance with one embodiment of the present invention.

FIG. 5 shows an exemplary block diagram of an embodiment of an I/O die 500 in accordance with one embodiment of the present invention. In one embodiment, most of I/O die 500 includes thick oxide transistors. I/O die 500 includes an I/O circuit 502. I/O circuit 502 may include multiple tiers 504, 506, and 508 of I/O elements 510, which may include I/O buffers, such as tri-state buffers. It is appreciated that the three tiers shown are for illustration purposes only and not intended to limit the scope of the present invention. For example, one embodiment may employ four tiers.

To avoid cluttering FIG. 5, only some (but not all) of the I/O elements in FIG. 5 have been referenced with the reference number 510. Multiple tiers include inner tier 504, middle tier 506, and outer tier 508. I/O circuit 502 may further include a noise reduction block 512 and a logic block 514. In one embodiment, logic block 514 may be an intellectual property (IP) block. Noise reduction block 512 may be a filter, a combination of one or more decoupling capacitors (DECAP), an electrostatic discharge (ESD) block, an analog circuitry or any combination thereof for reducing noise generated by one or more I/O elements 510. Examples of logic block 514 include a processor, a transceiver, a phase-locked loop (PLL), a memory block, such as a non-volatile memory, which may be a Flash memory or a programmable read-only memory (PROM). Logic block 514 may be manufactured by a third-party entity. For example, logic block 514 may be manufactured by a third-party entity that is different from an entity that manufactures I/O die 500. In this example, the third-party entity may be different from an entity that manufactures integrated circuit die 100. As another example, logic block 514 may be manufactured by a third-party entity that is different from an entity that configures I/O die 500. In this example, the third-party entity may be different from an entity that configures integrated circuit die 100.

Inner tier 504 is coupled with inner interface layer 108, in one instance. The middle tier 506 is coupled with middle interface layer 110 (FIG. 1), and outer tier 508 is coupled with outer interface layer 112 (FIG. 1). In an alternative embodiment, I/O die 500 excludes noise reduction block 512 and/or logic block 514.

As presented above, the I/O circuit 502 may include more or less than three tiers. It is appreciated that the number of tiers in the I/O circuit 502 matches the number of interface layers of integrated circuit die 100.

Figure 6:
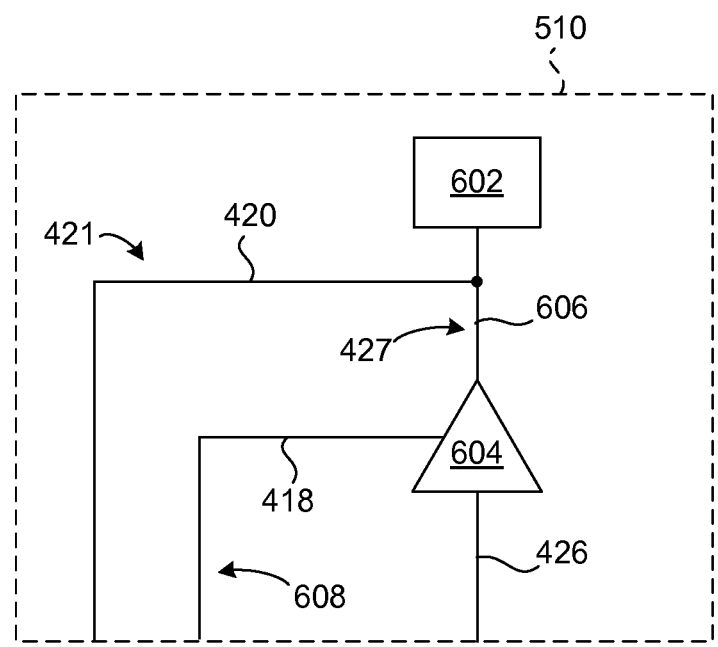
FIG. 6 shows an exemplary block diagram of an embodiment of an I/O element of the I/O die in accordance with one embodiment of the present invention.

FIG. 6 shows an exemplary block diagram of an embodiment of the I/O element 510 of the I/O die 500 in accordance with one embodiment of the present invention. In this embodiment, the I/O element 510 includes an I/O pad 602 and an I/O buffer 604, e.g., a tristate buffer. The I/O buffer 604 sends output signal 427, via an output line 606 to I/O pad 602, in response to receiving an enable signal 608. It is appreciated that the demultiplexer 402 receives the input signal 421 via input line 420 at a time when I/O buffer 604 in response to the enable signal 608 is disabled. The I/O element 510 may include different arrays of components, such as I/O buffers 604, to support different protocols, e.g., Erasable PROMs (EPROMs), Electrically Erasable PROMs (EEPROMs), Flash memory, etc.

Figure 7:
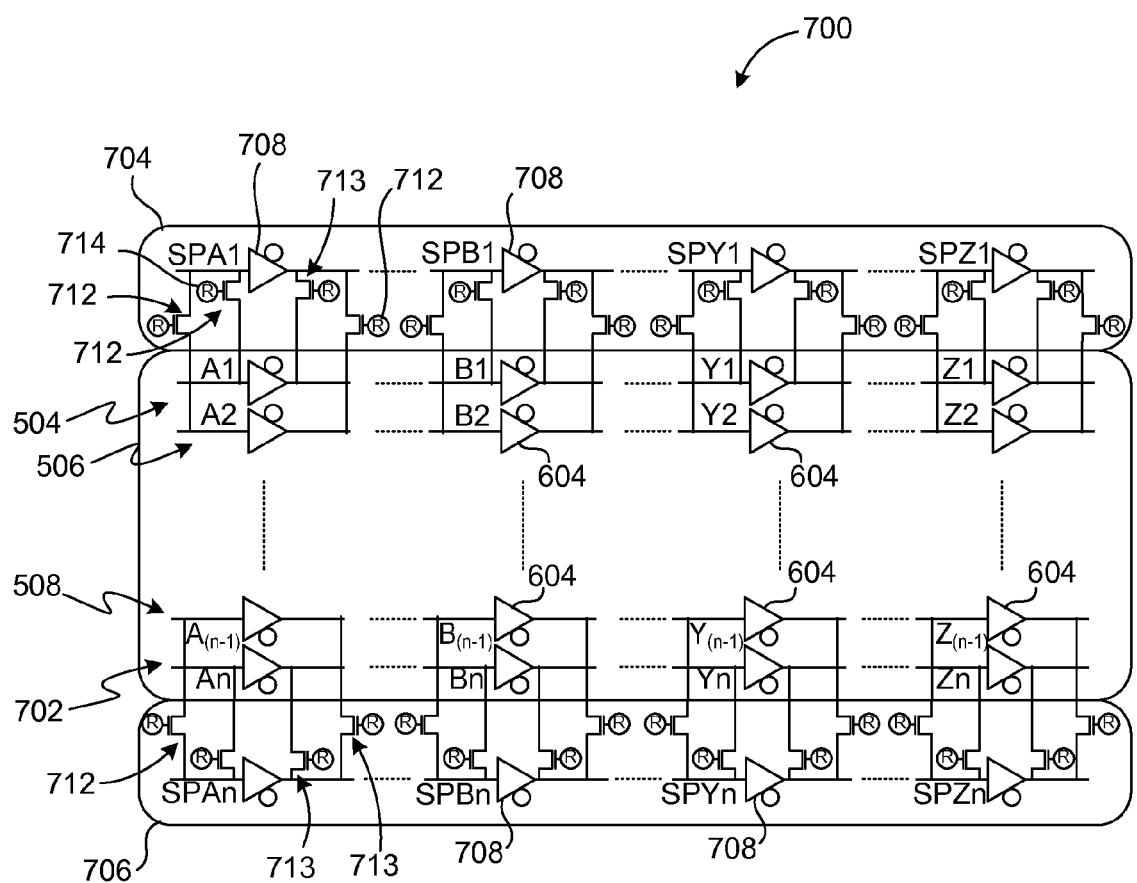
FIG. 7 shows an exemplary circuit diagram of an embodiment of an I/O circuit used for redundancy in accordance with one embodiment of the present invention.

FIG. 7 shows an exemplary circuit diagram of an embodiment of an I/O circuit 700 used for redundancy in accordance with one embodiment of the present invention. I/O circuit 700 includes n tiers of I/O elements 510 (FIG. 5), where n is an integer greater than zero. I/O circuit 700 may be incorporated within I/O die 500 and serves as a redundancy circuit. The n tiers include tiers 504, 506, 508, and 702. The n tiers may include active I/O buffers 604. I/O circuit 700 further includes two tiers 704 and 706 of passive I/O buffers 708. To avoid cluttering FIG. 7, only some (but not all) of the active I/O buffers in FIG. 7 have been referenced with the reference number 604 and only some (but not all) of the I/O buffers in FIG. 7 have been referenced with the reference number 708. Tiers 704 and 706 of passive I/O buffers 708 may further include multiple input transistors 712 and multiple output transistors 713. Each transistor 712 and 713 may be controlled by a configuration bit R stored within a storage unit 714. To avoid cluttering FIG. 7, only some (but not all) of the input transistors in FIG. 7 have been referenced with the reference number 712 and only some (but not all) of the output transistors have been referenced with the reference number 713. In addition, to avoid cluttering FIG. 7, only some (but not all) of the storage units in FIG. 7 have been referenced with the reference number 714. Input transistor 712 is connected to an input of passive I/O buffer 708 and output transistor 713 is connected to an output of passive I/O buffer 708. The value of configuration bit R may be one or zero.

If n is an even integer, an even number of the n tiers of active I/O buffers 604 is coupled with top tier 704 of passive I/O buffers 708 and the remaining number of the n tiers of active I/O buffers 604 is coupled with bottom tier 706 of passive I/O buffers 708. If n is an odd integer, an odd number of tiers of active I/O buffers 604 is coupled with top tier 704 of passive I/O buffers 708 and the remaining number of tiers of active I/O buffers 604 is coupled with bottom tier 706 of passive I/O buffers 708. The n number of active I/O buffers 604 share the same passive I/O buffer 708. For example, the active I/O buffers 604 A1 and A2 share the same passive I/O buffer 708 coupled with inputs of the active I/O buffers A1 and A2 and with outputs of the active I/O buffers A1 and A2.

At a time malfunction of the active I/O buffer An occurs, input transistor 712 coupled with an input of passive I/O buffer SPAn is made active by setting configuration bit R to a value of 1 and output transistor 713 coupled with an output of the passive I/O buffer SPAn is made active by setting configuration bit R to a value of 1. At a time transistors 712 and 713 are made active, passive I/O buffer SPAn is used instead of active I/O buffer to output the output signal 427 received at the input of the active I/O buffer An. Passive I/O buffer SPAn sends the output signal 427 (FIG. 4) to I/O pad 602 (FIG. 6) coupled with an output of the passive I/O buffer SPAn.

A ratio of passive I/O buffers 708 to active I/O buffers 604 depends on I/O density on surface of an I/O substrate. In one embodiment, the redundancy scheme does not change a design footprint. For example, a design of layout of passive I/O buffers 708 in top tier or bottom tier is the same as a design of layout of active I/O buffers 604 in any of the n tiers.

In another embodiment, I/O circuit 700 includes any number of tiers of passive I/O buffers 708. For example, although a single top tier 704 of passive I/O buffers 708, shown in FIG. 7, is used for redundancy of an odd or an even number of tiers of active I/O buffers 604, in another embodiment, more than one tier of passive I/O buffers 708 may be used for the odd or even number of tiers of active I/O buffers 604. As another example, although a single bottom tier 706 of passive I/O buffers 708, shown in FIG. 7, is used for redundancy of an odd or an even number of tiers of active I/O buffers 604, in another embodiment, more than one bottom tier of passive I/O buffers 708 may be used for the odd or even number of tiers of active I/O buffers 604.

Figure 8A:
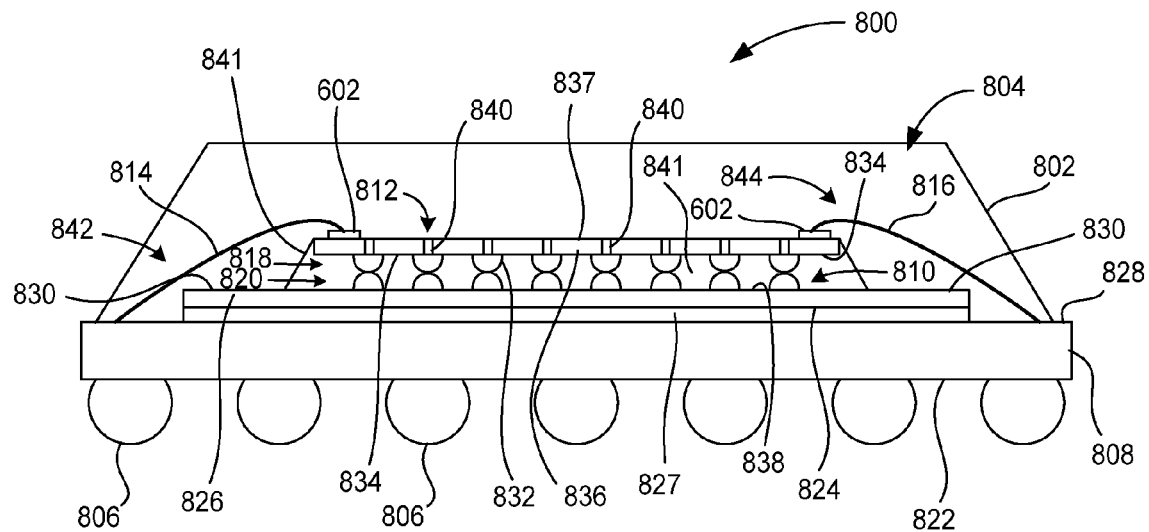
FIG. 8A shows an exemplary front view of an embodiment of an I/O system in accordance with one embodiment of the present invention.

FIG. 8A shows an exemplary front view of an embodiment of an I/O system 800 in accordance with one embodiment of the present invention. I/O system 800 includes an enclosure 802 and an I/O stack 804. I/O stack 804 includes multiple solder balls 806, an externally-connected substrate 808, an integrated circuit die 810, an I/O die 812, multiple wire bonds 814 and 816, and multiple bump arrays 818 and 820. In one embodiment, multiple bump arrays 810 and 820 are micro bump arrays. I/O stack 804 further includes an underfill layer 841 that is made of an underfill. In one embodiment, underfill layer 841 is made of a flip chip underfill available from Namics™ corporation. The underfill protects bump arrays 818 and 820. The multiple bump arrays include integrated circuit bump array 820 and I/O bump array 818. Enclosure 802 encloses bump arrays 818 and 820, I/O die 812, integrated circuit die 810, and wire bonds 814 and 816. I/O die 812 is an example of I/O die 500 (FIG. 5) and integrated circuit die 810 is an example of integrated circuit die 100 (FIG. 1).

Solder balls 806 are soldered to a bottom surface 822 of externally-connected substrate 808. Moreover, a bottom surface 824 of an integrated circuit substrate 826 of integrated circuit die 810 is attached via an attaching layer 827, such as an epoxy layer, to a top surface 828 of externally-connected substrate 808. An epoxy may be an adhesive. Multiple bumps 838 of integrated circuit bump array 820 are soldered to a top surface 830 of integrated circuit substrate 826. Further, multiple bumps 832 of I/O bump array 818 are soldered to a bottom surface 834 of an I/O substrate 836 of I/O die 812. I/O bumps 832 of I/O bump array 818 are aligned with integrated circuit bumps 838 of integrated circuit bump array 820. For example, I/O bump 832 is vertically aligned to be in contact with integrated circuit bump 838. As another example, a center or other part of a bottom surface of I/O bump 832 is aligned to be in contact with a center or another part of a bottom surface of integrated circuit bump 838. Underfill layer 941 acts as an electrical insulator between I/O bumps 832 and also acts as an electrical insulator between integrated circuit bumps 838. I/O pads 602 of I/O die 812 are wire-bonded via wire bonds 814 and 816 to top surface 828 of externally-connected substrate 808.

I/O substrate 836 includes multiple I/O through-silicon vias (TSVs) 840 that are formed in trenches etched along a height of I/O substrate 836. Fabrication of I/O TSVs 840 benefits from lower cost of I/O die 812. I/O TSVs 840 may include one or more metals, such as copper or tungsten. I/O bumps 832 are soldered to bottom surface 834 of I/O substrate 836 and are soldered to I/O TSVs 840 to establish contact with I/O TSVs 840.

An integrated circuit, such as integrated circuit 102 (FIG. 1), is located on top surface 830 of integrated circuit substrate 826. An I/O circuit, such as I/O circuit 502 (FIG. 5) or I/O circuit 700 (FIG. 7), is located on bottom surface 834 of I/O substrate 836.

It is noted that bottom surface 824 of integrated circuit substrate 826 faces a direction opposite to that faced by top surface 830 of integrated circuit substrate 826. Similarly, bottom surface 834 of I/O substrate 836 faces a direction opposite to that faced by a top surface 837 of I/O substrate 836 and bottom surface 822 of externally-connected substrate 808 faces a direction opposite to that faced by top surface 828 of externally-connected substrate 808. Power pads 602 are formed on top surface 837 of I/O substrate 836. Top-surface 828 of externally-connected substrate 808 faces bottom surface 824 of integrated circuit substrate 826 and top surface 830 of integrated circuit substrate 826 faces bottom surface 834 of I/O substrate 836. In one embodiment, fabrication of I/O pads 602 on top surface 837 of I/O substrate 836 and fabrication of I/O bumps 832 on bottom surface 834 of I/O substrate 836 allows a large population of I/O bumps 832 and I/O pads 602 to be fitted on I/O substrate 836.

A power signal 842 is supplied from one or more power sources, described below, on externally-connected substrate 808 via wire bond 814 and I/O pad 602 to I/O die 812. Moreover, a power signal 844 is supplied via wire bond 816, I/O pad 602, I/O TSV 840, I/O bump 832, integrated circuit bump 838, and any of interface layers 108, 110, and 112 to integrated circuit die 810.

In various embodiments, additional pads are located on top surface 837 to provide data, control, and clock signals to portions of I/O system 800.

Figure 8B:
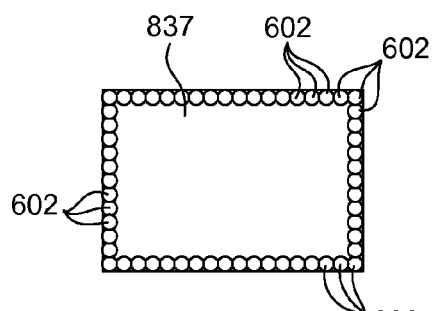
FIG. 8B shows an exemplary top view of a top surface of an I/O substrate of the I/O system of FIG. 8A in accordance with one embodiment of the present invention.
Figure 8C:
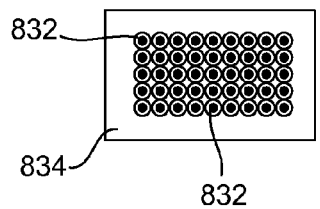
FIG. 8C shows an exemplary bottom view of a bottom surface of the I/O substrate in accordance with one embodiment of the present invention.
Figure 8D:
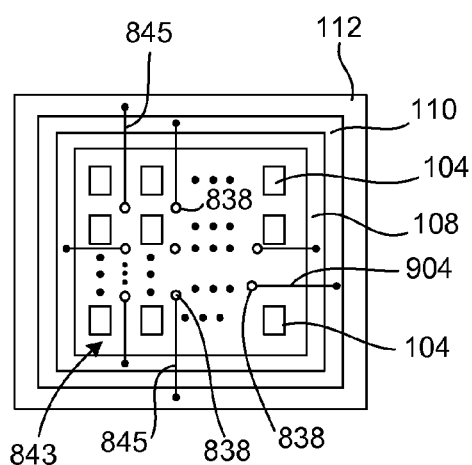
FIG. 8D shows an exemplary top view of a top surface of an integrated circuit die of the I/O system of FIG. 8A in accordance with one embodiment of the present invention.

FIG. 8B shows an exemplary top view of a top surface 837 of I/O substrate 836 of the I/O system 800 of FIG. 8A in accordance with one embodiment of the present invention. FIG. 8C shows an exemplary bottom view of a bottom surface 834 of the I/O substrate 836 in accordance with one embodiment of the present invention. FIG. 8D shows an exemplary top view of top surface 830 of integrated circuit die 100 of the I/O system 800 of FIG. 8A in accordance with one embodiment of the present invention. Each I/O pad 602 is located along, such as adjacent to, a periphery of I/O substrate 836. In one embodiment, the number of I/O bumps 832 are the same as the number of integrated circuit bumps 838 to establish a one-to-one connection between I/O bump and integrated circuit bump 838.

In one embodiment, integrated circuit bumps 838 are connected via a redistribution network (RDN) 843 to outer interface layer 112, middle interface layer 110, and inner interface layer 108. For example, integrated circuit bump 838 is connected via a redistribution conductor 845 to inner interface layer 108, integrated circuit bump 838 is connected via redistribution conductor 845 to middle interface layer 110, and integrated circuit bump 838 is connected via redistribution conductor 845 to outer interface layer 112.

The output signal 427 is sent from driver 410 (FIG. 4) via redistribution conductor 845, integrated circuit bump 838, I/O bump 832, I/O TSV 840, and I/O pad 602 to one or more of the externally-connected devices coupled with the I/O pad 602. The I/O bump 832 is in contact with the integrated circuit bump 838 and the I/O TSV 840 is in contact with the I/O bump 832. The input signal 421 is received by demultiplexer 402 (FIG. 4) from one or more of the externally-connected devices via I/O pad 602, I/O TSV 840, I/O bump 832, integrated circuit bump 838 in contact with the I/O bump 832, redistribution conductor 845, and driver 404 (FIG. 4). The I/O bump 832 is in contact with I/O TSV 840 and the I/O TSV 840 is in contact with I/O pad 602.

In an alternative embodiment, the number of I/O bumps 832 are different that the number of integrated circuit bumps 838. Moreover, in another alternative embodiment, I/O system 800 does not include underfill layer 841.

Figure 9:
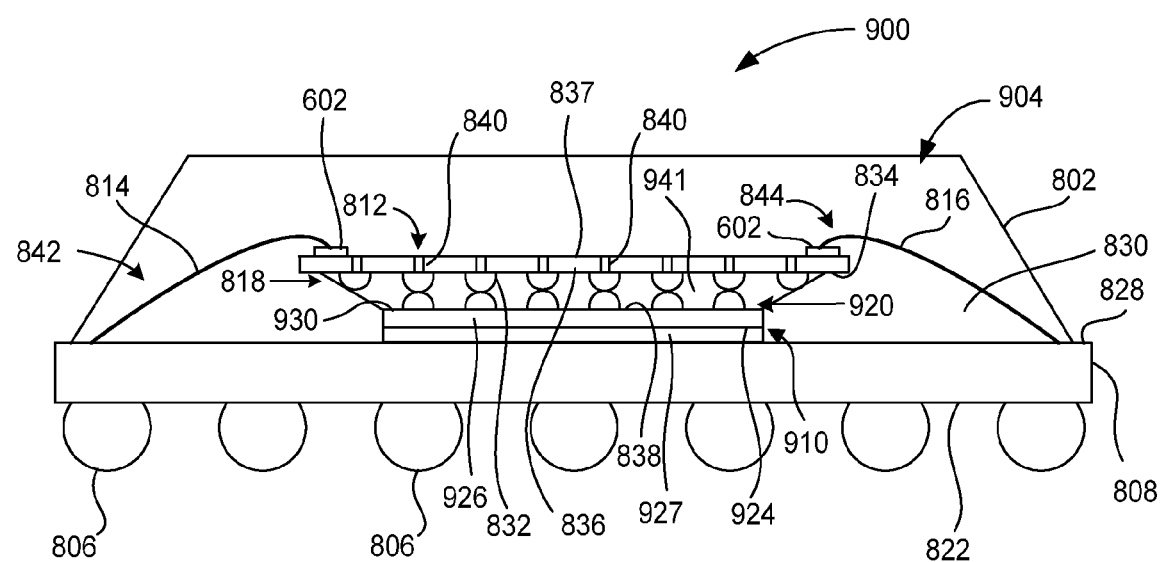
FIG. 9 shows an exemplary front view of another embodiment of an I/O system in accordance with one embodiment of the present invention.

FIG. 9 shows an exemplary front view of another embodiment of an I/O system 900 in accordance with one embodiment of the present invention. I/O system 900 is similar to I/O stack 800 (FIG. 8) except that I/O system 900 includes an I/O stack 904. I/O stack 904 is similar to I/O stack 804 except that I/O stack 904 includes an integrated circuit die 910 and a bump array 920, which is a micro bump array. I/O stack 904 further includes an underfill layer 941 that is made of an underfill. Underfill layer 941 protects bump array 920 and a portion of bump array 818. Integrated circuit die 910 is an example of integrated circuit die 100 (FIG. 1).

Moreover, a bottom surface 924 of an integrated circuit substrate 926 of integrated circuit die 910 is attached via an attaching layer 927, such as an epoxy layer, to top surface 828 of externally-connected substrate 808. Multiple bumps 838 of integrated circuit bump array 920 are soldered to a top surface 930 of integrated circuit substrate 826. I/O bumps 832 of I/O bump array 818 are aligned with integrated circuit bumps 838 of integrated circuit bump array 920. Integrated circuit 102 (FIG. 1) is located on top surface 930 of integrated circuit substrate 926.

It is noted that bottom surface 924 of integrated circuit substrate 926 faces a direction opposite to that faced by top surface 930 of integrated circuit substrate 926. Top-surface 828 of externally-connected substrate 808 faces bottom surface 924 of integrated circuit substrate 826 and top surface 930 of integrated circuit substrate 926 faces bottom surface 834 of I/O substrate 836.

Power signal 844 is supplied via wire bond 816, I/O pad 602, I/O TSV 840, I/O bump 832, integrated circuit bump 938, and any of interface layers 108, 110, and 112 to integrated circuit die 910.

I/O system 900 is similar to I/O system 800 except that integrated circuit die 910 has a smaller surface area than a surface area of integrated circuit die 810 (FIG. 8A). In another alternative embodiment, I/O system 900 does not include underfill layer 941.

Figure 10A:
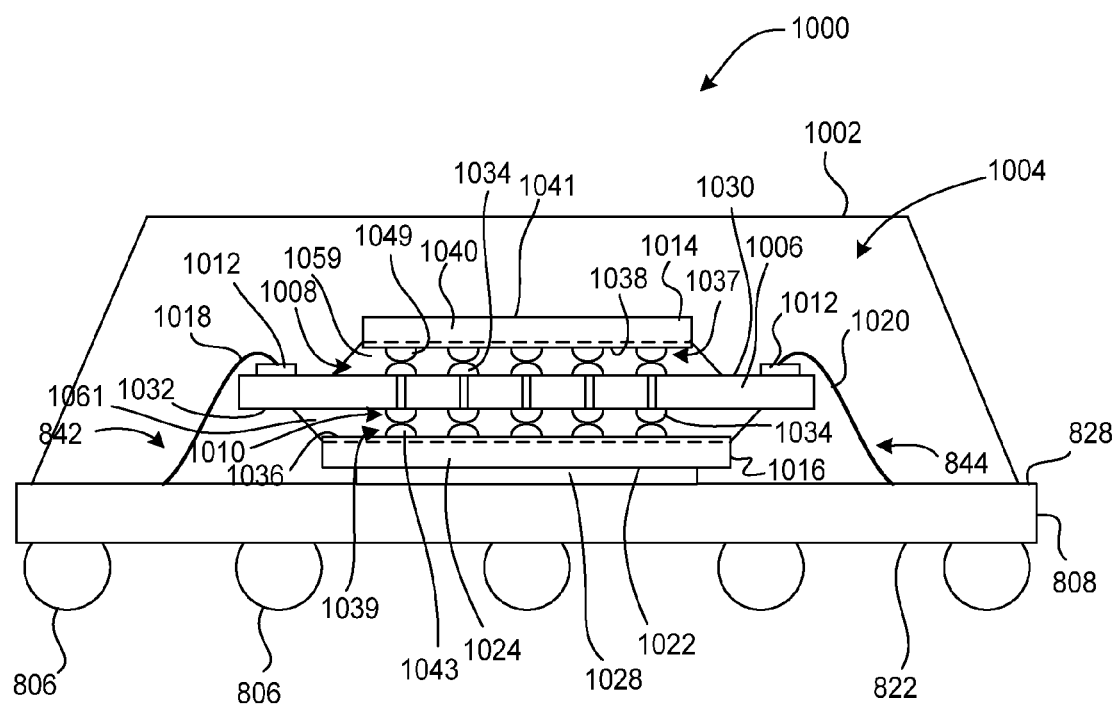
FIG. 10A shows an exemplary front view of yet another embodiment of an I/O system in accordance with one embodiment of the present invention.

FIG. 10A shows an exemplary front view of yet another embodiment of an I/O system 1000 in accordance with one embodiment of the present invention. I/O system 1000 includes an enclosure 1002 and an I/O stack 1004. I/O stack 1004 includes multiple solder balls 806, externally-connected substrate 808, a silicon interposer 1006, top silicon interposer bump array 1008, bottom silicon interposer bump array 1010, multiple power pads 1012, an I/O die 1014, an integrated circuit die 1016, multiple wire bonds 1018 and 1020, an I/O bump array 1037, and an integrated circuit bump array 1039. I/O die 1014 is an example of I/O die 500 (FIG. 5) and integrated circuit die 1016 is an example of integrated circuit die 100 (FIG. 1). I/O bump array 1037 includes multiple bumps 1043, which are micro bumps, and integrated circuit bump array 1039 includes multiple bumps 1049, which are also micro bumps. I/O stack 1004 further includes a top underfill layer 1059 that is made of an underfill. Top underfill layer 1059 protects bump arrays 1037 and 1008. I/O stack 1004 also includes a bottom underfill layer 1061 that is made of an underfill and protects bump arrays 1039 and 1010.

Enclosure 1002 encloses I/O die 1014, silicon interposer 1006, top silicon interposer bump array 1008, bottom silicon interposer bump array 1010, and integrated circuit die 1016. A bottom surface 1022 of an integrated circuit substrate 1024 of integrated circuit die 1016 is attached via an attaching layer 1028, such as an epoxy layer, to top surface 828 of externally-connected substrate 808.

Top silicon interposer bump array 1008 is soldered to a top surface 1030 of silicon interposer 1006 and bottom silicon interposer bump array 1010 is soldered to a bottom surface 1032 of silicon interposer 1006. Top underfill layer 1059 is located above top surface 1030 and bottom underfill layer 1061 is located below bottom surface 1032. Top silicon interposer bump array 1008 includes multiple bumps 1034, such as microbumps and bottom silicon interposer bump array 1010 includes multiple bumps 1034, such as microbumps. Top underfill layer 1059 acts as an electrical insulator between bumps 1034 of top silicon interposer bump array 1008 and also acts as an electrical insulator between bumps 1043. Bottom underfill layer 1061 acts as an electrical insulator between bumps 1034 of bottom silicon interposer bump array 1010 and acts as an electrical insulator between integrated circuit bumps 1049. Multiple silicon interposer TSVs 1035 are formed by filling trenches etched within silicon interposer 1006. Silicon interposer TSV 1035 couples silicon interposer bump 1034 of top silicon interposer bump array 1008 with bump 1034 of bottom silicon interposer bump array 1010. Power pads 1012 are formed on top surface 1030 of silicon interposer 1006 and are wire-bonded to top surface 828 of externally-connected substrate 808. Wire-bonds 1018 and 1020 are wire-bonded onto power pads 1012 on top surface 1030 of silicon interposer 1006.

An integrated circuit, such as integrated circuit 102 (FIG. 1), is located on a top surface 1036 of integrated circuit substrate 1024. An I/O circuit, such as I/O circuit 502 or I/O circuit 700, is located on a bottom surface 1038 of an I/O substrate 1040 of I/O die 1014. It is noted that bottom surface 1022 of integrated circuit substrate 1024 faces a direction opposite to that faced by top surface 1036 of integrated circuit substrate 1024. Similarly, bottom surface 1038 of I/O substrate 1040 faces a direction opposite to that faced by top surface 1041 of I/O substrate 1040. Top-surface 828 of externally-connected substrate 808 faces bottom surface 1022 of integrated circuit substrate 1024, top surface 1036 of integrated circuit substrate 1024 faces bottom surface 1032 of silicon interposer 1006, and top surface 1030 of silicon interposer 1006 faces bottom surface 1038 of I/O substrate 1040.

In various embodiments, additional pads are located on top surface 1030 to provide data, control, and clock signals to portions of I/O system 1000. In an alternative embodiment, I/O system 1000 does not include top underfill layer 1059 and bottom underfill layer 1061.

Figure 10B:
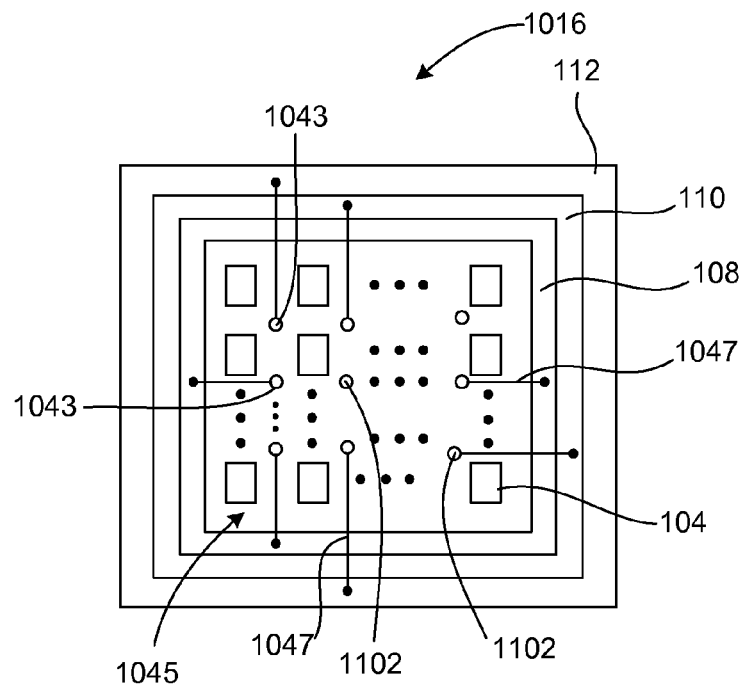
FIG. 10B shows an exemplary top view of an embodiment of an integrated circuit die of the I/O system of FIG. 10A in accordance with one embodiment of the present invention.

FIG. 10B shows an exemplary top view of an embodiment of integrated circuit die 1016 of the I/O system 1000 of FIG. 10A in accordance with one embodiment of the present invention. Integrated circuit die 1016 includes bumps 1043 that are in contact with bottom silicon interposer bump array 1010 (FIG. 10A). Integrated circuit die 1016 also includes an RDN 1045 that includes multiple redistribution conductors 1047 coupled with interface layers 108, 110, and 112. For example, redistribution conductor 1047 couples bump 1043 with inner interface layer 108, redistribution conductor 1047 couples bump 1043 with middle interface layer 110, and redistribution conductor 1047 couples bump 1043 with outer interface layer 112.

Figure 10C:
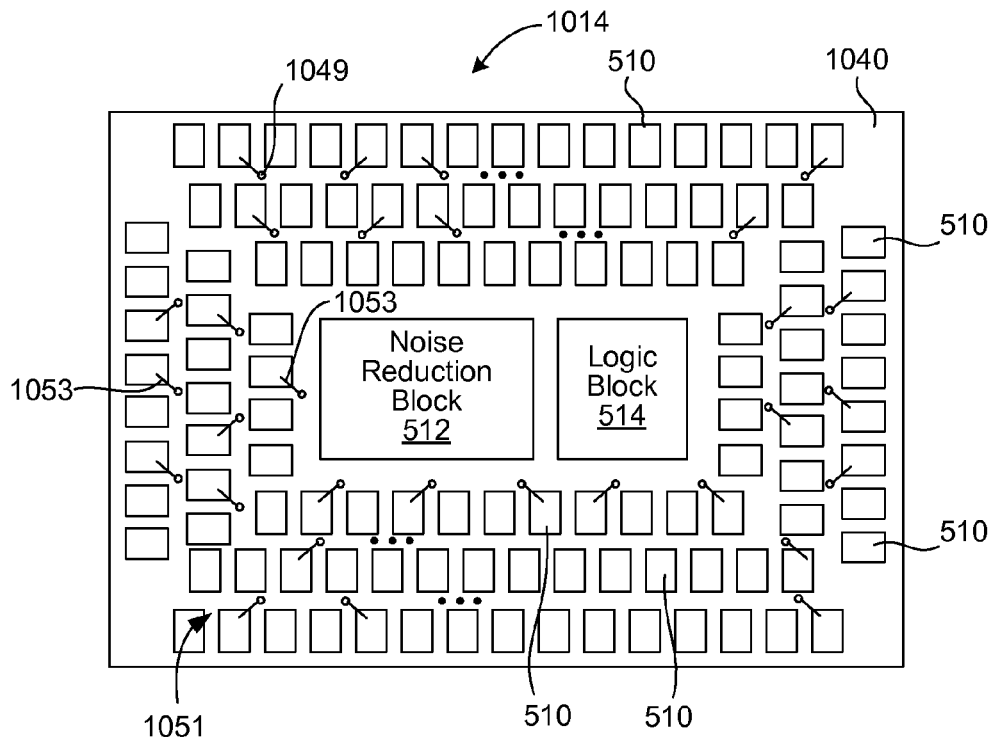
FIG. 10C shows an exemplary bottom view of an embodiment of an I/O die of the I/O system of FIG. 10A in accordance with one embodiment of the present invention.

FIG. 10C shows an exemplary bottom view of an embodiment of I/O die 1014 of the I/O system 1000 of FIG. 10A in accordance with one embodiment of the present invention. I/O die 1014 includes multiple bumps 1049 that are in contact with top silicon interposer bump array 1008. I/O die 1014 also includes an RDN 1051 that includes multiple redistribution conductors 1053 coupled with I/O elements 510. For example, redistribution conductor 1053 couples bump 1049 with I/O element 510.

The output signal 427 (FIG. 4) output from multiplexer 405 (FIG. 4) is output via driver 410 (FIG. 4), redistribution conductor 1047 (FIG. 10B), bump 1043 (FIG. 10B), bump 1034 (FIG. 10A) of bottom silicon interposer bump array 1010 (FIG. 10A), silicon interposer TSV 1035 (FIG. 10A), bump 1034 (FIG. 10A) of silicon interposer top bump array 1008 (FIG. 10A), bump 1049, redistribution conductor 1053, and I/O pad 602 (FIG. 10A) to one or more of the externally-connected devices. The silicon interposer TSV 1035 (FIG. 10A) is soldered to bumps 1034 (FIG. 10A) of arrays 1008 and 1010 (FIG. 10A). The input signal 421 (FIG. 4) is input from one or more of the externally-connected devices via I/O pad 602 (FIG. 6), redistribution conductor 1053, bump 1049, bump 1034 (FIG. 10A) of top silicon interposer bump array 1008 (FIG. 10A), silicon interposer TSV 1035 (FIG. 10A), bump 1034 (FIG. 10A) of bottom silicon interposer bump array 1010 (FIG. 10A), bump 1043 (FIG. 10B), redistribution conductor 1047 (FIG. 10B), and driver 404 (FIG. 4) to demultiplexer 402 (FIG. 4).

Power signal 842 (FIG. 10A) is supplied via wire-bond 1018 (FIG. 10A), power pad 1012 (FIG. 10A), an RDN on top surface 1030 (FIG. 10A) of silicon interposer 1006 (FIG. 10A), bump 1034 (FIG. 10A) of top silicon interposer bump array 1008 (FIG. 10A), bump 1049 on bottom surface 1038 of I/O substrate 1040, and redistribution conductor 1053 on bottom surface 1038 (FIG. 10A) of I/O substrate 1040 (FIG. 10A) to I/O pad 602 (FIG. 6). Moreover, power signal 844 is supplied via wire-bond 1020, power pad 1012 (FIG. 10A), the RDN on top surface 1030 (FIG. 10A) of silicon interposer 1006 (FIG. 10A), silicon interposer TSV 1035 (FIG. 10A), bump 1034 (FIG. 10A) of bottom silicon interposer bump array 1010 (FIG. 10A), bump 1043 (FIG. 10A) on top surface 1036 (FIG. 10A) of integrated circuit substrate 1024 (FIG. 10A), and redistribution conductor 1047 (FIG. 10B) to interface layer 108, 110, or 112 (FIG. 10B).

Figure 11:
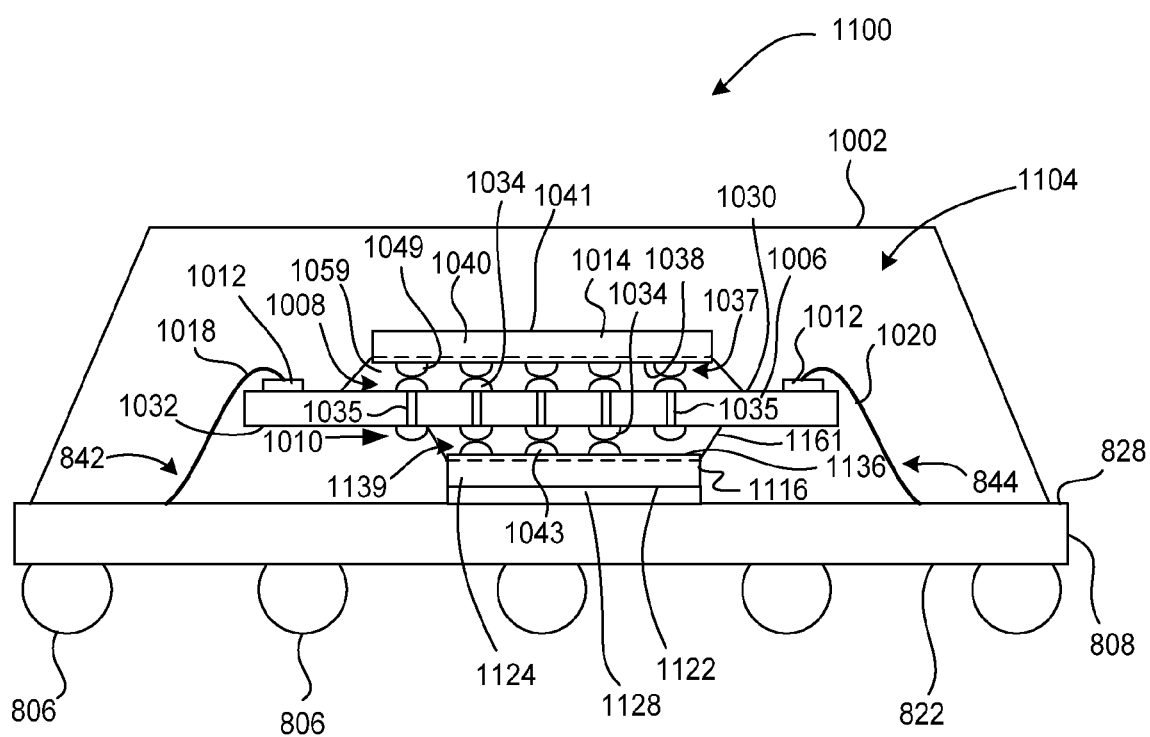
FIG. 11 shows an exemplary front view of another embodiment of an I/O system in accordance with one embodiment of the present invention.

FIG. 11 shows an exemplary front view of another embodiment of an I/O system 1100 in accordance with one embodiment of the present invention. I/O system 1100 is similar to I/O system 1000 (FIG. 10A) except that I/O system 1100 includes an I/O stack 1104. I/O stack 1104 is similar to I/O stack 1004 except that I/O stack 1104 includes an integrated circuit die 1116 and an integrated circuit bump array 1139. Integrated circuit die 1116 is an example of integrated circuit die 100 (FIG. 1). Integrated circuit bump array 1139 includes multiple bumps 1043. I/O stack 1104 is similar to I/O stack 1004 except that I/O stack 1104 includes a bottom underfill layer 1161 that is made of an underfill and protects bump array 1139 and a portion of bump array 1010.

A bottom surface 1122 of an integrated circuit substrate 1124 of integrated circuit die 1116 is attached via an attaching layer 1128, such as an epoxy layer, to top surface 828 of externally-connected substrate 808.

Bottom underfill layer 1161 acts as an electrical insulator between bumps 1034 of bottom silicon interposer bump array 1010 and acts as an electrical insulator between integrated circuit bumps 1043 of bump array 1139.

Integrated circuit 102 (FIG. 1) is located on a top surface 1136 of integrated circuit substrate 1124. It is noted that bottom surface 1122 of integrated circuit substrate 1024 faces a direction opposite to that faced by top surface 1136 of integrated circuit substrate 1024. Top-surface 828 of externally-connected substrate 808 faces bottom surface 1122 of integrated circuit substrate 1024, and top surface 1136 of integrated circuit substrate 1024 faces bottom surface 1032 of silicon interposer 1006.

It is noted that the surface area of top surface 1136 is smaller than the surface area of bottom surface 1038. Similarly, the surface area of top surface 1036 is larger than the surface area of bottom surface 1038.

Figure 12:
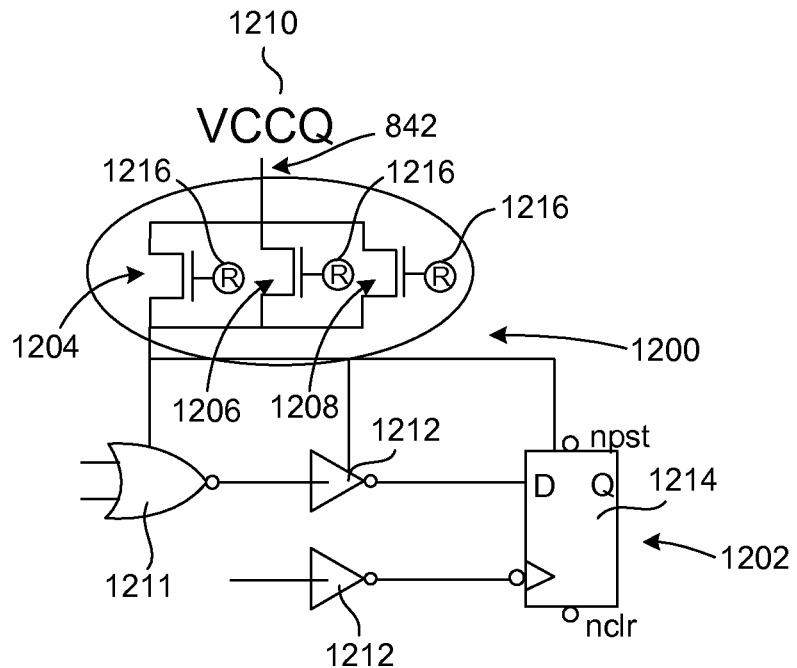
FIG. 12 shows an exemplary circuit diagram of an embodiment of a power distribution network that supplies power to the integrated circuit die in accordance with one embodiment of the present invention.

FIG. 12 shows an exemplary circuit diagram of an embodiment of a power distribution network that supplies power to the integrated circuit die 100 (FIG. 1) in accordance with one embodiment of the present invention. Power distribution network 1200 supplies power to multiple components 1202 of integrated circuit 102 (FIG. 1), such as blocks 104 (FIG. 1) and/or interfaces 108, 110, and 112 (FIG. 1). Power distribution network 1200 includes multiple transistors 1204, 1206, and 1208, a power source 1210 (VCCQ), which is located on externally-connected substrate 808 (FIGS. 8A, 9, 10A, and 11). Power distribution network 1200 also includes multiple conductors connecting power source 1210 to transistors 1204, 1206, and 1208 and connecting the transistors 1204, 1206, and 1208 to components 1202. In one embodiment, each transistor 1204, 1206, and 1208 is a pass gate. Exemplary components 1202 of integrated circuit 102 include a NOR gate 1211, multiple inverters 1212, and a D flip-flop 1214. Power distribution network 1200 except for power source 1210 is a part of integrated circuit die 100 (FIG. 1).

An amount of power supplied to components 1202 is controlled by controlling a number of transistors 1204, 1206, and 1208 that are active. To reduce an amount of power, of power signal 842, supplied by power source 1210 to components 1202, one or more transistors 1204, 1206, and 1208 are turned off via corresponding one or more configuration bits R stored in storage units 1216. On the other hand, to increase an amount of power, of power signal 842, supplied to components 1202, one or more transistors 1204, 1206, and 1208 are turned on via configuration bits R. A sum of power output from all transistors 1204, 1206, and 1208 is supplied to components 1202.

At a time integrated circuit 102 (FIG. 1) is in a standby mode, an amount of power, of power signal 842 may be reduced to a level sufficient to sustain configuration data, such as configuration bits, of integrated circuit 102. For example, during the standby mode in which bit R of storage unit 1216 coupled with transistor 1204 is already asserted, the bit R and/or a bit R of storage unit 1216 coupled with transistor 1208 is deasserted. The deeassertion reduces an amount of power of power signal 842 supplied to components 1202. In one embodiment, the sufficient level of power for a particular mode (e.g., standby mode) is indicated by a user via an input device, such as a mouse or a keyboard, coupled with a computer system further coupled with integrated circuit 102. The above-mentioned power reduction reduces static leakage current and static power consumption. During the standby mode, static power is consumed by components 1202 of integrated circuit 102 that are not active, such as in an off state.

During an active mode, dynamic power is consumed by components 1202 of integrated circuit 102 that are active, such as in an on state. During the active mode in which bit R of storage unit 1216 coupled with transistor 1204 is already asserted, a bit R of storage unit 1216 coupled with transistor 1206 and/or a bit R of storage unit 1216 coupled with transistor 1208 is asserted. The assertion increases an amount of power of power signal 842 supplied to components 1202.

Moreover, in various embodiments, at a time integrated circuit 102 detects that a triggering event occurs, such as an event of nonuse of a cellular phone or a computer for a certain amount of time, integrated circuit 102 switches from the active mode to the standby mode. During the standby mode, a bit R of storage unit 1216 coupled with transistor 1206 and/or a bit R coupled with storage unit 1216 coupled with transistor 1208 is deasserted. The deassertion decreases the amount of power of power signal 842 supplied to components 1202.

In one embodiment, power source 1210 is also a part of integrated circuit die 100 (FIG. 1). Although three transistors 1204, 1206, and 1208 are shown, in another embodiment, more or less than three transistors can be used. In various embodiments, instead of single power source 1210, multiple power sources, such as, for example, VCCQ1 and VCCQ2, can be used for providing power to the various transistors 1204, 1206, and 1208. For example, the power source VCCQ1 may provide power to one or two of the transistors 1204, 1206, and 1208, and the other power source VCCQ2 may provide power to the remaining of the transistors 1204, 1206, and 1206. In these embodiments, there is an isolation between circuitry that is used to supply power from the power source VCCQ1 and circuitry that is used to supply power from the power source VCCQ2.

Figure 13:
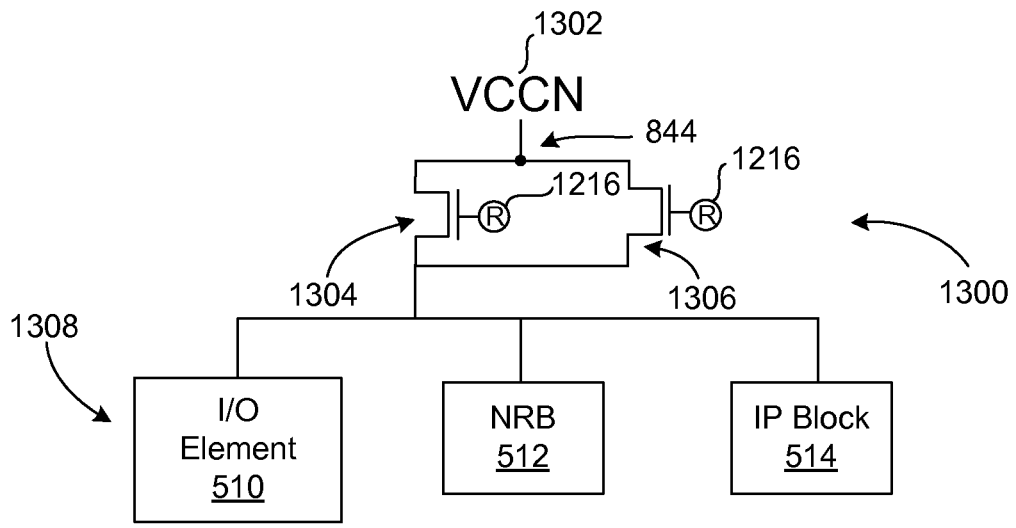
FIG. 13 shows an exemplary block diagram of an embodiment of a power distribution network that supplies power to the I/O die in accordance with one embodiment of the present invention.

FIG. 13 shows an exemplary block diagram of an embodiment of a power distribution network 1300 that supplies power to the I/O die 500 (FIG. 5) in accordance with one embodiment of the present invention. Power distribution network 1300 includes a power source 1302, which is an example of one or more power sources on externally-connected substrate 808 (FIGS. 8A, 9, 10A, and 11). Power distribution network 1300 further includes multiple transistors 1304 and 1306, which are bypass gates, and conductors connecting power source 1302 to transistors 1304 and 1306. Power distribution network 1300 further includes conductors connecting transistors 1304 and 1306 to multiple components 1308. Components 1308 may include I/O elements 510 (FIG. 5), logic block 514 (FIG. 5), and/or noise reducing block 512 (FIG. 5), which are components of I/O die 500 (FIG. 5). Power distribution network 1300 except for power source 1302 is a part of I/O die 500 (FIG. 5).

Power source 1302 supplies power signal 844 (FIGS. 8A, 9, 10A, and 11) to components 1308 via transistors 1304 and 1306. An amount of power, of power signal 844, supplied by power source 1302 to components 1308 is controlled by turning on or off transistors 1304 and 1306. Transistor 1304 or 1306 is turned on or off by changing a value of a configuration bit R of storage unit 1216 coupled with the transistor.

An amount of power supplied to components 1308 is controlled by controlling a number of transistors 1304 and 1306 that are active. To reduce an amount of power, of power signal 844 (FIGS. 8A, 9, 10A, and 11), supplied by power source 1302 to components 1308, one or more transistors 1304 and 1306 are turned off via corresponding one or more configuration bits R stored in storage units 1216. On the other hand, to increase an amount of power, of power signal 844, supplied to components 1308, one or more transistors 1304 and 1306 are turned on via corresponding one or more configuration bits R. A sum of power output from all transistors 1304 and 1306 is supplied to components 1308.

At a time I/O circuit 502 (FIG. 5) is in a standby mode, an amount of power, of power signal 844 may be reduced to a level sufficient to sustain configuration data of I/O circuit 502 (FIG. 5). For example, during the standby mode in which a bit R of storage unit 1216 coupled with transistor 1304 is already asserted, bit R of storage unit 1216 coupled with transistor 1306 is deasserted to reduce an amount of power of power signal 844 supplied to components 1308. During the standby mode, static power is consumed by components 1308 that are not active.

During an active mode, dynamic power is consumed by components 1308 that are active. During the active mode in which bit R of storage unit 1216 coupled with transistor 1304 is already asserted, bit R of storage unit 1216 coupled with transistor 1306 is asserted to increase an amount of power, of power signal 844, supplied to components 1308.

Moreover, in various embodiments, at a time I/O circuit 502 detects that the triggering event occurs, I/O circuit 502 switches from the active mode to the standby mode and bit R of storage unit 1216 coupled with storage unit 1216 of transistor 1306 is deasserted to decrease an amount of power, of power signal 844, supplied to components 1308.

In one embodiment, power source 1302 is also a part of I/O die 500 (FIG. 5).

Although two transistors 1304 and 1306 are shown, in another embodiment, more or less than two transistors 1304 and 1306 can be used. In various embodiments, instead of single power source 1302, multiple power sources, such as, for example, VCCN1 and VCCN2, can be used to supply power to the various transistors 1304 and 1306. For example, the power source VCCN1 supplies power to transistor 1304 and power source VCCN2 provides power to transistor 1306. In these embodiments, there is an electrical isolation between circuitry that is used to supply power from the power source VCCN1 and circuitry that is used to supply power from the power source VCCN2.

Separation of portions of or entire power distribution networks 1200 and 1300 (FIGS. 12 and 13) onto two separate dies allow integrated circuit 102 (FIG. 1) and I/O circuit 502 (FIG. 5) to be powered down separately. For example, turning off transistors 1204, 1206, and 1208 (FIG. 12) powers down integrated circuit 102 (FIG. 1) and turning off transistors 1304 and 1306 (FIG. 13) powers down I/O circuit 502 (FIG. 5). Moreover, separation of portions of or entire power distribution networks 1200 and 1300 allows separate control of integrated circuit 102 (FIG. 1) and I/O circuit 502 (FIG. 5). For example, integrated circuit 102 may receive a low amount of power at a time integrated circuit 102 is in the standby mode than an amount of power received by I/O circuit 502 that is in an active mode.

The separation of portions of or entire power distribution networks 1200 and 1300 due to separation of integrated circuit die 100 (FIG. 1) from I/O die 500 (FIG. 5) improves jitter performance compared to that in the conventional die.

Separation of integrated circuit 102 (FIG. 1) from I/O die 500 (FIG. 5) provides better power management for both dynamic and static power than that provided by locating a conventional I/O element and a conventional integrated circuit on the same conventional die. Since integrated circuit 102 (FIG. 1) is separated from I/O die 500 (FIG. 1), dynamic current from toggling of I/O elements 510 (FIG. 5) or from simultaneous screeching noise (SSN) does not affect or minimally affects integrated circuit 102 (FIG. 1). Moreover, since integrated circuit 102 (FIG. 1) is separated from I/O die 500

(FIG. 1), dynamic current from toggling of components of integrated circuit 102 does not affect or minimally affects I/O elements 510 (FIG. 5).

Figure 14:
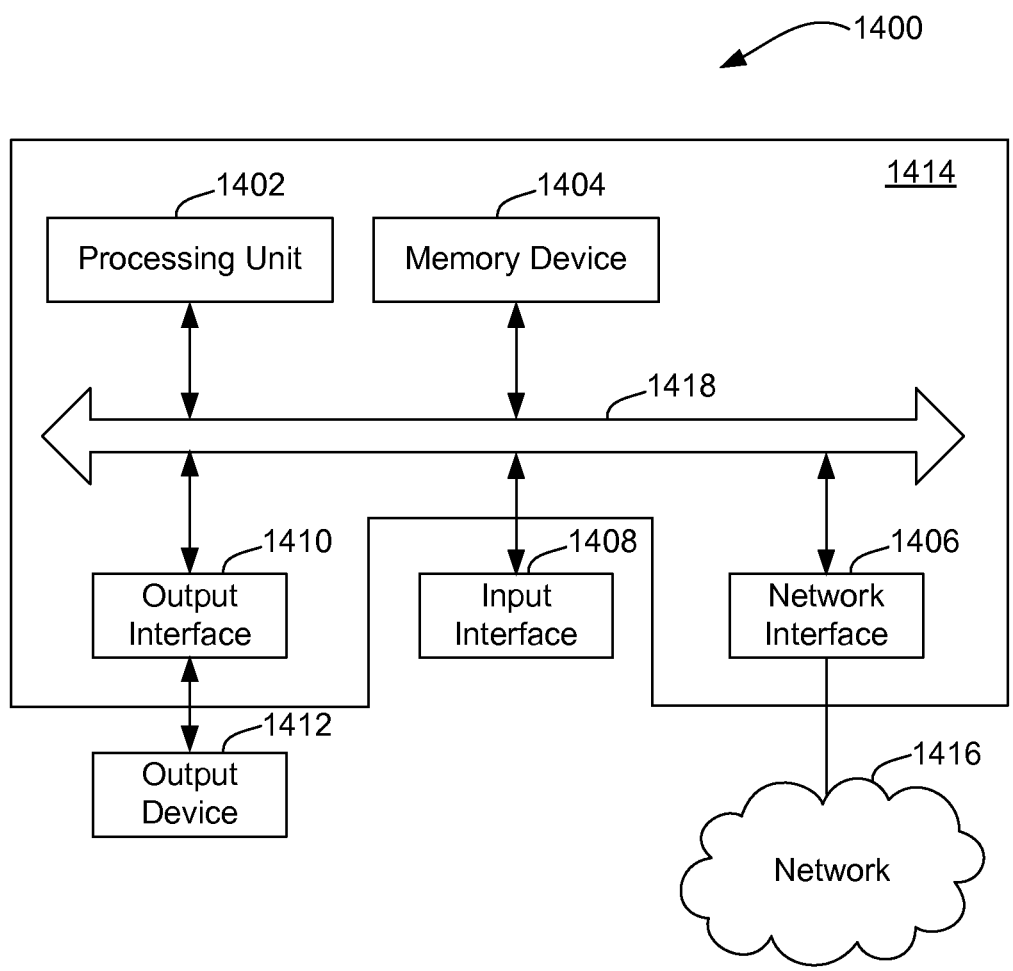
FIG. 14 shows an exemplary block diagram of a computer system for executing a compilation method for compiling a configuration of the I/O system of FIGS. 8A, 9, 10A, and 11 in accordance with one embodiment of the present invention.

FIG. 14 shows an exemplary block diagram of a computer system for executing a compilation method for compiling a configuration of the I/O system of FIGS. 8A, 9, 10A, and 11 in accordance with one embodiment of the present invention. Computer system 1400 includes a processing unit 1402, a memory device 1404, a network interface 1406, an input device 1408, an output interface 1410, and an output device 1412. Network interface 1406, output interface 1410, memory device 1404, and processing unit 1402 may be located within a housing 1414 of computer system 1400.

Processing unit 1402 may be a central processing unit (CPU), a microprocessor, a floating point coprocessor, a graphics coprocessor, a hardware controller, a microcontroller, a programmable logic device programmed for use as a controller, a network controller, or other processing unit. Memory device 1404 may be a RAM, a ROM, or a combination of RAM and ROM. For example, memory device 1404 includes a computer-readable medium, such as a floppy disk, a ZIP™ disk, a magnetic disk, a hard disk, a compact disc-ROM (CD-ROM), a recordable CD, a digital video disc (DVD), blue-ray disk, Universal Serial Bus (USB) stick, or a flash memory. Memory device 1404 stores a program code for performing methods, described herein, for designing and configuring I/O system 800 (FIG. 8A), 900 (FIG. 9), 1000 (FIG. 10A), or 1100 (FIG. 11).

Network interface 1406 may be a modem or a network interface card (NIC) that allows processing unit 1402 to communicate with a network 1416, such as a wide area network (WAN) or a local area network (LAN). Processing unit 1402 may be connected via a wireless connection or a wired connection to network 1416. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 1408 include a mouse, a keyboard, a stylus, or a keypad. Output device 1412 may be a liquid crystal display (LCD) device, a plasma display device, a light emitting diode (LED) display device, or a cathode ray tube (CRT) display device. Examples of output interface 1410 include a video controller that drives output device 1412 to display one or more images based on instructions received from processing unit 1402. Processing unit 1402 accesses the program code from memory device 1404 or from a remote memory device (not shown) via network 1416, and executes the program code. Processing unit 1402, memory device 1404, network interface 1406, input device 1408, output interface 1410, and output device 1412 communicate with each other via a bus 1418. In various embodiments, system 1400 may not include input device 1408 and/or network interface 1406.

Figure 15:
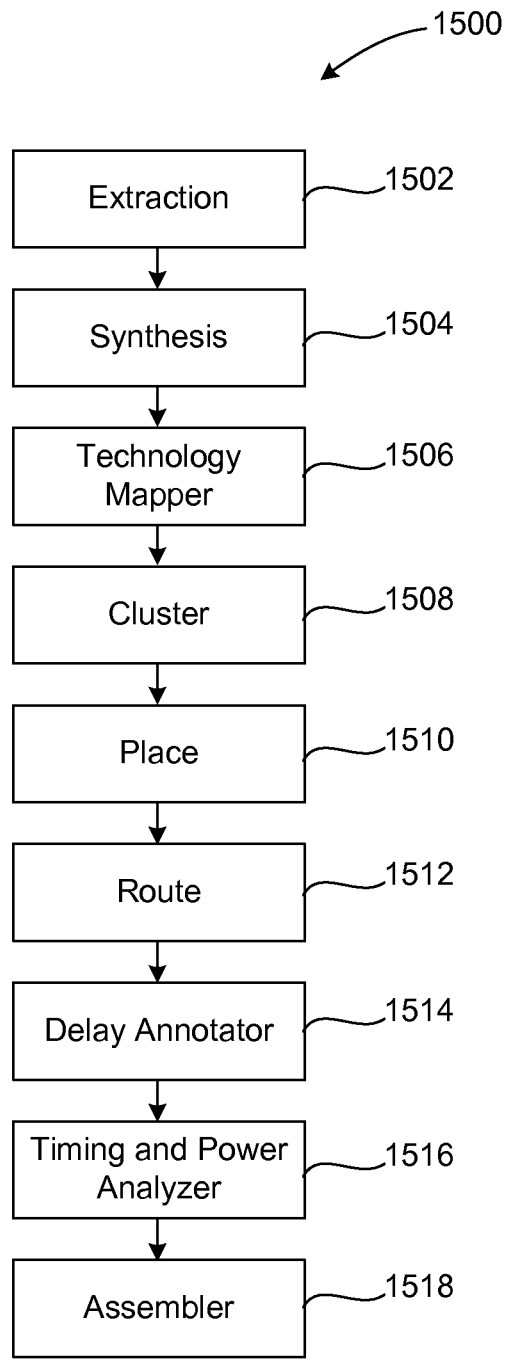
FIG. 15 shows an exemplary flowchart of an embodiment of the compilation method in accordance with one embodiment of the present invention.

FIG. 15 shows an exemplary flowchart of an embodiment of a compilation method 1500 in accordance with one embodiment of the present invention. Compilation method 1500 is used to generate configuration information for designing and configuring I/O system 800 (FIG. 8A), 900 (FIG. 9), 1000 (FIG. 10A), or 1100 (FIG. 11). Compilation method 1500 includes an extract phase 1502, a synthesis phase 1504, a technology mapping phase 1506, a cluster phase 1508, a place phase 1510, a route phase 1512, a delay annotator phase 1514, a timing and power analysis phase 1516, and an assembler phase 1518. Processing unit 1402 accesses a program code for performing compilation method 1500 from memory device 204 or the remote memory device, and executes the compilation method 1500.

Processing unit 1402 executes the program code for performing compilation method 1500 to convert a user design expressed, for example, as a Hardware Description Language (HDL) or a high-level language by a user, into the configuration information. The configuration information is used to configure I/O system 800 (FIG. 8A), 900 (FIG. 9), 1000 (FIG. 10A), or 1100 (FIG. 11) to implement the user design. Processing unit 1402 executes extract phase 1502 to convert the user design into a register transfer layer (RTL) description.

Processing unit 1402 executes synthesis phase 1504 to convert the RTL description of the user design into a set of logic gates. Processing unit 1402 executes technology mapping phase 1506 to map the set of logic gates into a set of atoms, which are irreducible constituents of the user design. The atoms may correspond to groups of logic gates and other components of the user design matching the capabilities of LEs 202 (FIG. 2) or other functional blocks of I/O system 800 (FIG. 8A), 900 (FIG. 9), 1000 (FIG. 10A), or 1100 (FIG. 11). The user design may be converted into any number of different sets of atoms, depending upon the underlying hardware of I/O system 800 (FIG. 8A), 900 (FIG. 9), 1000 (FIG. 10A), or 1100 (FIG. 11) used to implement the user design.

Processing unit 1402 further executes cluster phase 1508 to group related atoms together into clusters. Processing unit 1402 also executes place phase 1510 to assign clusters of atoms to locations on I/O system 800 (FIG. 8A), 900 (FIG. 9), 1000 (FIG. 10A), or 1100 (FIG. 11). Processing unit 1402 executes route phase 1512 to determine a configuration of multiple configurable switching circuits of PLD 300 (FIG. 3) used to connect the atoms implementing the user design. Processing unit 1402 executes delay annotator phase 1514 to determine multiple signal delays, such as data delays, for the set of atoms and their associated connections in the configurable switching circuits by using a timing model of I/O system 800 (FIG. 8A), 900 (FIG. 9), 1000 (FIG. 10A), or 1100 (FIG. 11). Processing unit 1402 executes timing and power analysis phase 1516 to determine whether the implementation of the user design in I/O system 800 (FIG. 8A), 900 (FIG. 9), 1000 (FIG. 10A), or 1100 (FIG. 11) will meet multiple long-path and short-path timing constraints and power usage constraints specified by the user via input device 1408 (FIG. 14).

Processing unit 1402 executes assembler phase 1518 to generate the configuration information specifying configuration of I/O system 800 (FIG. 8A), 900 (FIG. 9), 1000 (FIG. 10A), or 1100 (FIG. 11) implementing the user design. The configuration of I/O system 800, 900, 1000, or 1100 may include configuration of each LE 202 used to implement the user design and/or the configuration of a configurable switching circuit used to connect the LEs 202 (FIG. 2). Processing unit 1402 executes assembler phase 1518 to write the configuration information to a configuration file, which can be stored within memory device 1404 (FIG. 14) and can then be accessed by processing unit 1402 to configure I/O system 800 (FIG. 8A), 900 (FIG. 9), 1000 (FIG. 10A), or 1100 (FIG. 11) to implement instances of the user design.

Figure 16:
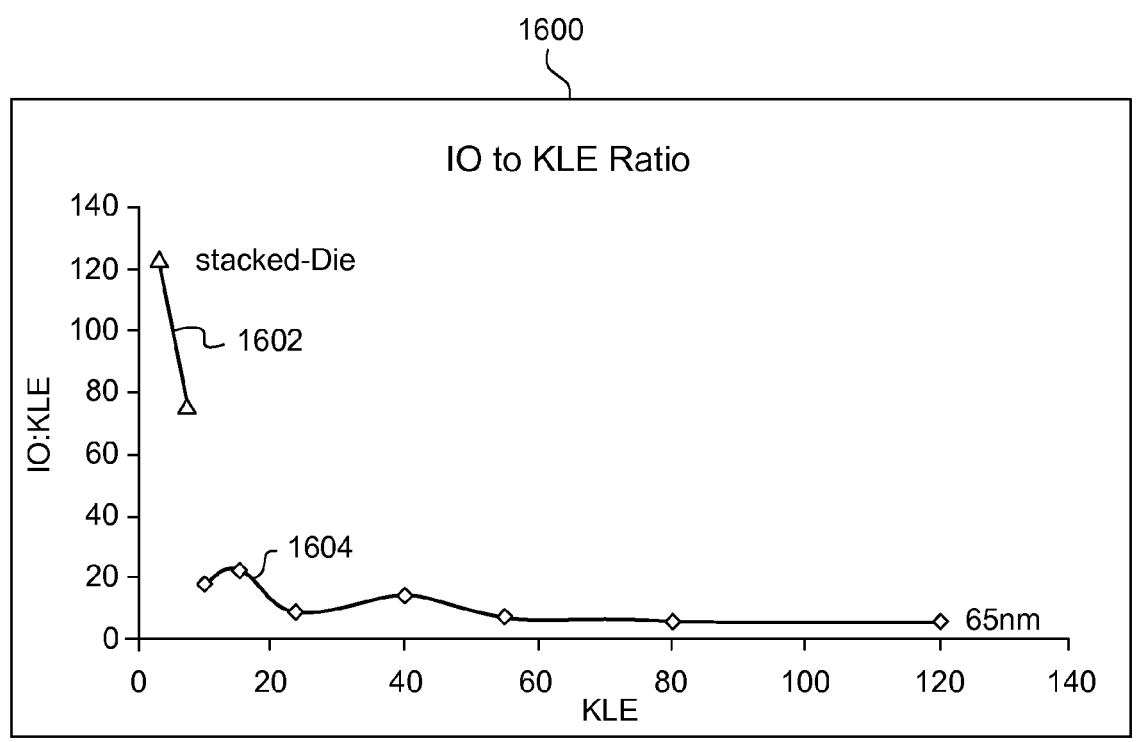
FIG. 16 shows an exemplary graph illustrating a benefit of applying an embodiment of the method of fabricating an I/O stack in accordance with one embodiment of the present invention.

FIG. 16 shows an exemplary graph 1600 illustrating a benefit of applying an embodiment of the method of fabricating an I/O stack in accordance with one embodiment of the present invention. A y-axis of graph 1600 plots a ratio of a number of I/O elements to a number, in thousands, of LEs. An x-axis of graph 1600 plots the number of LEs. A line segment 1602 represents a change in a ratio of I/O elements to LEs with an increase in the number of LEs of integrated circuit according to an embodiment of the present invention. A curve 1604 represents a change in a ratio of conventional I/O elements to conventional LEs of the conventional die with an increase in the number of conventional LEs. The use of I/O system, according to an embodiment of the present invention, results in an increase in the number of I/O elements for the same number of LEs. The same number of I/O elements can be used as the number of LEs increases. The number of I/O elements used is higher than the number of conventional I/O elements of the conventional die. The number of conventional LEs is equal to the number of the LEs in accordance with one embodiment of the present invention.

The separation of the I/O circuit from the integrated circuit is achieved by creating an I/O stack, according to an embodiment of the present invention. Moreover, the separation of the I/O circuit from the integrated circuit is achieved by using TSVs, according to an embodiment of the present invention. I/O stack 804 (FIG. 8A), I/O stack 904 (FIG. 9), I/O stack 1004 (FIG. 10A), or I/O stack 1104 (FIG. 11) provides a larger count of I/O elements 510 (FIG. 5) than that achieved in the conventional die. Hence, the unbalanced shrinking is compensated by providing I/O stack 804 (FIG. 8A), I/O stack 904 (FIG. 9), I/O stack 1004 (FIG. 10A), or I/O stack 1104 (FIG. 11).

I/O stack 804 (FIG. 8A), I/O stack 904 (FIG. 9), I/O stack 1004 (FIG. 10A), or I/O stack 1104 (FIG. 11) occupies less surface area on externally-connected substrate 808 with higher footprint density to reduce cost of corresponding I/O system 800 (FIG. 8A), I/O system 900 (FIG. 9), I/O system 1000 (FIG. 10A), or I/O system 1100 (FIG. 11). With an increase in I/O density of I/O elements 510 (FIG. 5) on surface area of I/O substrate 836 (FIGS. 8A and 9) or I/O substrate 1040 (FIGS. 10A and 11), cost of I/O die 500 (FIG. 5) is reduced. Such reduction in cost is illustrated in Table I.

TABLE I

| Target I/O Count | Device | Die Area | Die Cost | I/O Cost |
| --- | --- | --- | --- | --- |
| 350 I/O | Stacked Die (3KLE) | 0.76 | 0.80 | 0.75 |
| | Single Die (16KLE) | 1 | 1 | 1 |
| | % Reduction | 24% | 20% | 25% |
| 530 I/O | Stacked Die (7KLE) | 0.59 | 0.60 | 0.60 |
| | Single Die (40KLE) | 1 | 1 | 1 |
| | % Reduction | 41% | 40% | 40% |

As illustrated in Table I, if I/O stack 804 (FIG. 8A), I/O stack 904 (FIG. 9), I/O stack 1004 (FIG. 10A), or I/O stack 1104 (FIG. 11) is used, for the same count 350 of I/O elements 510 (FIG. 5), there is at least a 24% reduction in use of surface area of externally-connected substrate 808 than that used by the conventional die, at least a 20% reduction in cost than that of the conventional die, and at least a 25% reduction in cost than the cost of conventional I/O elements in the conventional die. Moreover, as illustrated in Table I, if I/O stack 804 (FIG. 8A), I/O stack 904 (FIG. 9), I/O stack 1004 (FIG. 10A), or I/O stack 1104 (FIG. 11) is used, for the same count 530 of I/O elements 510 (FIG. 5), there is at least a 41% reduction in use of surface area of externally-connected substrate 808 than that used by the conventional die, at least a 40% reduction in cost than that of the conventional die, and at least a 40% reduction in cost than the cost of conventional I/O elements in the conventional die.

It is noted that although TSVs are used, in various embodiments, complementary metal-oxide-semiconductor (CMOS) transistor vias, Copper-pillars (Cu-pillar), or a Cu-fuse metal lines, can be used instead. It is further noted that although the above-described embodiments of the systems and methods for fabricating an I/O stack are described with respect to an FPGA, the system and methods can also apply to an ASIC, a custom ASIC, microprocessor sub-system, or a digital signal processing (DSP) system. It is also noted that in various embodiments, integrated circuit die 100 (FIG. 1) is stacked on top of I/O die 500 (FIG. 5).

Technical effects of the herein described systems and methods for fabricating an I/O stack include encouraging independent development efforts of integrated circuit die 100 (FIG. 1) and I/O die 500 (FIG. 5). The encouragement is provided by separation of I/O elements 510 (FIG. 5) onto I/O substrate 836 (FIG. 8) or 1040 (FIG. 10A) from blocks 104 (FIG. 1) on integrated circuit substrate 826 (FIG. 8A), 926 (FIG. 9), 1024 (FIG. 10A), or 1124 (FIG. 11). Most components of I/O die 500 (FIG. 5) are usually analog basic, and I/O die 500 is more process dependent that integrated circuit die 100 (FIG. 1), most components of which are digital basic. The separation minimizes design risk to reduce development costs.

LE 202 (FIG. 2) constructed from thin oxide transistors usually shrinks with Moore's Law for each new process generation. However, the I/O die, which is fabricated from thick oxide transistors, does not shrink with the same pace as the LE. Instead, the I/O die shrinks at a slower pace than the LE. Separating the I/O die 500 (FIG. 5) from integrated circuit die 100 (FIG. 1) allows the Moore's Law to continue benefiting integrated circuit 102 (FIG. 1) with low cost of LEs 202 (FIG. 2). Such a benefit is achieved while low cost of I/O elements 510 (FIG. 5) is achieved with I/O stack 804 (FIG. 8A), 904 (FIG. 9), 1004 (FIG. 10A), or 1104 (FIG. 11).

I/O stack 804 (FIG. 8A) or 1004 (FIG. 10A) reduces chances of integrated circuit 102 (FIG. 1) becoming an I/O bound circuit. In an I/O bound circuit, shrinkage of conventional LEs cannot help save cost of the conventional die. Further, I/O stack 804 or 1004 (FIGS. 8A, 9, 10A, and 11) provides a better power distribution network (PDN) constant as compared to that provided by the conventional die.

Additionally, integrated circuit die 100 and I/O die 500 are process independent. Thus, I/O die 500 can be maintained in an existing process node while integrated circuit 102 (FIG. 1) migrates to new process generation. For example, integrated circuit die 100 (FIG. 1) is developed from a 28 nanometer (nm) process node while I/O die 500 (FIG. 5) is developed from a 65 nm process node. The process independence results in a shorter product development cycle and faster time to market of integrated circuit die 100 (FIG. 1). Moreover, a variety of combinations of sizes of I/O die 500 (FIG. 5) and integrated circuit die 100 (FIG. 1) can be achieved to widen the market. Use of the same size of I/O die 500 (FIG. 5) with different sizes of integrated circuit die 100 (FIG. 1) results in lesser usage of masks used to create I/O die 500 compared to that used in the conventional die.

Moreover, applying a redundancy strategy, such as that illustrated by using FIG. 7, on I/O die 500 (FIG. 5) allows better yield. The better yield implies a low cost of the I/O die 500. Furthermore, in various embodiments, separation of I/O die 500 (FIG. 5) from integrated circuit die 100 (FIG. 1) eases the conversion from integrated circuit 102 (FIG. 1) to a hardcopy device, such as a structured ASIC. In these embodiments, the ease of conversion is achieved because the integrated circuit die 100 can be replaced with the hardcopy device and I/O die 500 (FIG. 5) can be re-used with the hardcopy device. In addition, integrated circuit die 100 (FIG. 1) has simplified routing fabric compared to that of the conventional die due to an architecture of integrated circuit die 100 that is less complicated than that of the conventional die. In some embodiments, the routing fabric may be further simplified due to a reduction in count of LEs 202 compared to LEs of the conventional die and due to a smaller size of integrated circuit die 100 compared to the conventional die.

Moreover, noise reducing block 512 (FIG. 5) can be used in I/O die 500 (FIG. 5) while integrated circuit die 100 (FIG. 1) migrates to a new process generation to allow savings in wafer cost and test overhead. For example, the same ESD device can be used with a 28 nm integrated circuit die and a 65 nm integrated circuit die. In one embodiment, integrated circuit die 100 (shown in FIG. 1) is a 28 or 65 nm die. Further, since the same I/O die 500 can be applied across multiple integrated circuit dies, such as integrated circuit die 100 (FIG. 1), manufactured by a variety of process nodes, same bump arrays 818 (FIG. 8A) or 1037 (FIG. 10A) can be used with the integrated circuit dies.

Other technical effects include embedding third-party IP, such as logic block 514 (FIG. 5), into I/O substrate 836 (FIG. 8A) or 1040 (FIG. 10A) without impacting development of integrated circuit die 100 (FIG. 1). Still other technical effects include using the same timing analysis phase 1516 (FIG. 15) as that used for designing the conventional die although in various embodiments, a different timing analysis phase can be used instead.

Although the foregoing systems and methods have been described in detail by way of illustration and example for purposes of clarity and understanding, it will be recognized that the above described systems and methods may be embodied in numerous other specific variations and embodiments without departing from the spirit or essential characteristics of the systems and methods. Certain changes and modifications may be practiced, and it is understood that the systems and methods are not to be limited by the foregoing details, but rather are to be defined by the scope of the appended claims.

What is claimed is:

1. A system comprising:
   an input/output (I/O) die comprising an I/O substrate and a first plurality of elements, wherein the first plurality of elements comprises more I/O elements than logic elements and the I/O die comprise one or more of a noise reduction device, a phase-locked loop (PLL), or a transceiver; and
   an integrated circuit die coupled with the I/O die comprising an integrated circuit substrate, wherein the integrated circuit die comprises a second plurality of elements, the second plurality of elements including a number of logic elements and zero I/O elements, wherein:
   the I/O die is stacked above the integrated circuit die and includes:
      multiple tiers of active buffers, a tier of passive I/O buffers adjacent to the tiers of active buffers; and
      a switch configurable to establish a connection from one of the tiers of active buffers to the tier of passive buffers in response to a malfunction occurring at one of the tiers of active buffers.

2. The system of claim 1, wherein a number of logic elements in the I/O dies is zero.

3. The system of claim 1, wherein the I/O die comprises an I/O substrate and the integrated circuit die comprises an integrated circuit substrate, the system further comprising:
   a bump array below a bottom surface of the I/O substrate of the I/O die; and
   a bump array above a top surface of the integrated circuit substrate of the integrated circuit die, wherein the bump array of the I/O die is configurable to be aligned with the bump array of the integrated circuit die.

4. The system of claim 1, wherein the I/O die comprises an I/O pad and an I/O substrate, wherein the integrated circuit die comprises an integrated circuit substrate, the system further comprising:
   an externally-connected substrate, wherein the integrated circuit substrate is stacked above the externally-connected substrate; and
   a wire-bond configurable to bond the I/O pad of the I/O die with the externally-connected substrate.

5. The system of claim 1, further comprising:
   an I/O pad array above a top surface of the I/O substrate.

6. The system of claim 1, wherein the switch includes an input transistor coupled with an input of the tier of passive buffers and an output transistor coupled with an output of the tier of passive buffers.

7. The system of claim 1, wherein the integrated circuit die comprises an integrated circuit substrate, the system further comprising multiple layers of interfaces above a top surface of the integrated circuit substrate.

8. The system of claim 1, further comprising:
   an interposer between the I/O die and the integrated circuit die, wherein the interposer comprises an interposer substrate, wherein the interposer substrate is stacked above the integrated circuit substrate, wherein the I/O substrate is stacked above the interposer substrate;
   a bump array above a top surface of the interposer substrate;
   a bump array below a bottom surface of the interposer substrate;
   a bump array below a surface of the I/O die;
   a bump array above a surface of the integrated circuit die;
   a via across a height of the interposer substrate; and
   an externally-connected substrate stacked below the integrated circuit die, wherein the interposer is wirebonded to the externally-connected substrate.

9. The system of claim 1, wherein the integrated circuit die comprises a programmable logic device, an Application Specific Integrated circuit (ASIC), a custom ASIC, a digital signal processing system, or a microprocessor sub-system.

10. The system of claim 1, further comprising:
    a first power network configurable to supply power to the I/O elements of the I/O die; and
    a second power network configurable to supply power to the logic elements of the integrated circuit die.

11. The system of claim 4, further comprising a via across the externally-connected substrate.

12. The system of claim 5, further comprising a noise reduction device and a logic block above the top surface of the I/O substrate, wherein the noise reduction device is configurable to reduce noise among the I/O elements of the I/O die, and wherein the logic block is configurable to store data.

13. The system of claim 7, wherein each layer of interface comprises a driver, a multiplexer, and a global wire.

14. The system of claim 10, wherein the first power network comprises a first power source and the second power network comprises a second power source.

* * * * *